United States Patent
Ishibashi

(10) Patent No.: US 9,142,399 B2
(45) Date of Patent: Sep. 22, 2015

(54) SUBSTRATE CLEANING METHOD

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 143 days.

(21) Appl. No.: 13/758,226

(22) Filed: Feb. 4, 2013

(65) Prior Publication Data

US 2013/0220368 A1    Aug. 29, 2013

(30) Foreign Application Priority Data

Feb. 23, 2012   (JP) .................................. 2012-37395

(51) Int. Cl.
| | |
|---|---|
| H01L 21/02 | (2006.01) |
| H01L 21/67 | (2006.01) |
| H01L 21/687 | (2006.01) |

(52) U.S. Cl.
CPC .... *H01L 21/02074* (2013.01); *H01L 21/02063* (2013.01); *H01L 21/6715* (2013.01); *H01L 21/67046* (2013.01); *H01L 21/67051* (2013.01); *H01L 21/68728* (2013.01)

(58) Field of Classification Search
None
See application file for complete search history.

(56) References Cited

U.S. PATENT DOCUMENTS

| | | | |
|---|---|---|---|
| 6,423,148 B1* | 7/2002 | Aoki ................................. | 134/3 |
| 2002/0005214 A1* | 1/2002 | Tomita et al. ................... | 134/36 |
| 2003/0087524 A1* | 5/2003 | Aoki et al. ..................... | 438/691 |
| 2008/0047583 A1* | 2/2008 | Fukunaga et al. ................ | 134/3 |
| 2008/0173327 A1* | 7/2008 | Miyagi .......................... | 134/1.3 |

FOREIGN PATENT DOCUMENTS

| | | |
|---|---|---|
| JP | 2009-231628 | 10/2009 |
| JP | 2009-238896 | 10/2009 |
| JP | 2010-238850 | 10/2010 |

* cited by examiner

*Primary Examiner* — Michael Kornakov
*Assistant Examiner* — Ryan Coleman
(74) *Attorney, Agent, or Firm* — Wenderoth, Lind & Ponack, L.L.P.

(57) ABSTRACT

A substrate cleaning method can prevent corrosion of copper interconnects even when the cleaning method, which uses two-fluid jet cleaning, is used for cleaning of a surface of a substrate after polishing. The substrate cleaning method includes: carrying out primary cleaning of a surface of a substrate by scrub cleaning using a neutral or alkaline liquid chemical as a cleaning liquid; carrying out finish cleaning of the surface of the substrate by two-fluid jet cleaning which cleans the surface of the substrate in a non-contact manner by jetting carbonated water, comprising pure water or ultrapure water containing dissolved $CO_2$ gas, from a two-fluid nozzle toward the surface of the substrate; and subsequently carrying out final finish cleaning of the surface of the substrate by scrub cleaning using a neutral or alkaline liquid chemical as a cleaning liquid, and then drying the surface of the substrate.

4 Claims, 22 Drawing Sheets

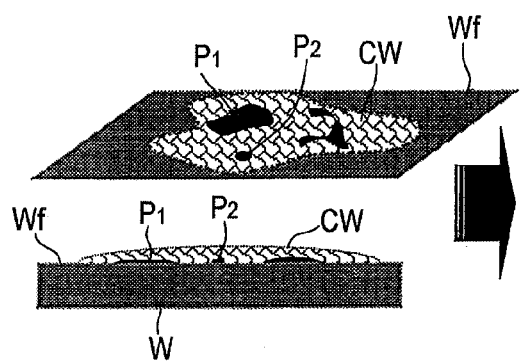 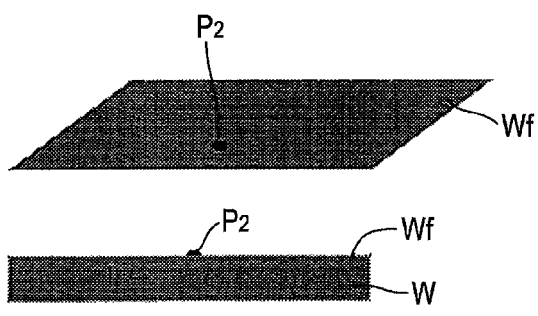
FIG. 16A　　　FIG. 16B

SUBSTRATE CLEANING METHOD

CROSS REFERENCE TO RELATED APPLICATIONS

This document claims priority to Japanese Patent Application No. 2012-037395, filed Feb. 23, 2012, the entire contents of which are hereby incorporated by reference.

BACKGROUND OF THE INVENTION

1. Field of the Invention

The present invention relates to a substrate cleaning method for cleaning a surface of a substrate such as a semiconductor wafer, and more particularly to a substrate cleaning method for use in a substrate cleaning process for cleaning a surface of a substrate after polishing such as CMP. The substrate cleaning method of the present invention can be applied also in a cleaning process, e.g., in the production of a flat panel, a CMOS or CCD image sensor, or a magnetic film in an MRAM.

2. Description of the Related Art

In a damascene interconnect forming process for forming interconnects in a surface of a substrate by filling a metal into interconnect trenches formed in an insulating film in the surface of the substrate, for example, an extra metal on the surface of the substrate is polished away by chemical mechanical polishing (CMP) after the formation of damascene interconnects. A slurry (residual slurry), remaining after its use in CMP, metal polishing debris, etc. are present on the surface of the substrate after CMP. Therefore, such residues (particles), remaining on the surface of the substrate after CMP, need to be cleaned off. These days copper as an interconnect metal and a so-called low-k film having a low dielectric constant as an insulating film have come to be used in damascene interconnects. The hydrophobic properties of a low-k film leads to non-uniform wetting properties of a surface of a substrate after CMP, on which copper and a low-k film are exposed. This makes cleaning of such a surface of a substrate difficult.

As a cleaning method for cleaning a surface of a substrate after CMP, a roll scrub cleaning method is known which comprises scrubbing the surface of the substrate, such as semiconductor wafer, with a long cylindrical roll cleaning member (roll sponge or roll brush) by rotating the substrate and the roll cleaning member while keeping the roll cleaning member in contact with the surface of the substrate in the presence of a cleaning liquid.

In roll scrub cleaning of a surface of a substrate by a roll cleaning member, as the roll cleaning member becomes contaminated, the surface of the substrate can be contaminated by the contaminated cleaning member especially when the surface of the substrate is hydrophobic. A pencil scrub cleaning method is known to be effective for cleaning a surface of a substrate which has undergone such back contamination. In particular, a surface of a substrate after roll scrub cleaning is cleaned with a vertically-extending pencil-type cleaning member by rotating the substrate and the pencil-type cleaning member while keeping the surface of the substrate in contact with a lower surface of the pencil-type cleaning member in the presence of a cleaning liquid. Such pencil scrub cleaning can remove back contamination of the surface of the substrate from a roll cleaning member and can enhance the overall cleaning performance due to the integrated effect of roll scrub cleaning and pencil scrub cleaning.

FIG. 1 is a flow chart showing an exemplary cleaning process in which a surface of a substrate after polishing is successively cleaned by roll scrub cleaning and pencil scrub cleaning, followed by drying. First, roll scrub cleaning of a surface of a substrate after polishing is carried out by rubbing a rotating roll cleaning member against the surface of the substrate while horizontally rotating the substrate and supplying a cleaning liquid, which is an acidic liquid chemical, to the surface of the substrate. Thereafter, a rinsing liquid, such as pure water, is supplied to the surface of the substrate to rinse off the cleaning liquid (liquid chemical) remaining on the surface of the substrate. Next, pencil scrub cleaning of the surface of the substrate is carried out by rubbing a lower surface of a rotating pencil-type cleaning member against the surface of the substrate while horizontally rotating the substrate and supplying a cleaning liquid, which is an acidic liquid chemical, to the surface of the substrate. Thereafter, a rinsing liquid, such as pure water, is supplied to the surface of the substrate to rinse off the cleaning liquid (liquid chemical) remaining on the surface of the substrate. The substrate after cleaning is then dried, e.g., by spin-drying.

When a surface of a substrate is polished, recessed portions can be formed in the surface of the substrate due to dishing or erosion. It is generally difficult to remove particles, existing in such recessed potions, by scrub cleaning. Two-fluid jet (2FJ) cleaning using a two-fluid jet is known to be effective for removal of such particles. The two-fluid jet cleaning method is mainly employed for an interconnect metal which hardly corrodes by oxidation, such as tungsten, or in the production of an article in which corrosion of copper interconnects does not affect the product performance.

The two-fluid jet cleaning is a non-contact cleaning method which, unlike ultrasonic cleaning which is another non-contact cleaning method, is free from a fear of destruction of a substrate due to cavitation, and which is known to be effective for removal of particles, especially relatively large particles (e.g., having a particle diameter of more than 100 to 200 nm), adhering to a surface of a substrate with a relatively small adhesion force. When ultrapure water is used as a cleaning liquid, there is a fear of electrostatic destruction of a surface to be cleaned, e.g., a surface of an insulating film, because of the high resistivity of ultrapure water. Therefore, carbonated water, comprising pure water or ultrapure water containing dissolved $CO_2$, is generally used as a cleaning liquid.

A substrate processing method with high cleaning performance has been proposed which cleans a surface of a substrate by successively carrying out scrub cleaning of the surface of the substrate with a cleaning brush and two-fluid jet cleaning of the surface of the substrate by the use of a two-fluid nozzle (see patent document 1). Further, the use of an alkaline cleaning liquid, e.g., in scrub cleaning has been proposed in order to prevent a lowering of the reliability of copper interconnects and a lowering of the product yield due to short circuit or open circuit of the interconnects (see patent document 2).

The applicant has proposed a substrate cleaning method with high cleaning performance which comprises carrying out scrub cleaning of a surface of a substrate, e.g. after polishing, with a roll cleaning member, and then carrying out two-fluid jet cleaning of the surface of the substrate using water (carbonated water) containing dissolved $CO_2$ gas as a cleaning liquid, followed by drying the surface of the substrate (see patent document 3).

FIG. 2 is a flow chart showing an exemplary cleaning process in which a surface of a substrate after polishing is successively cleaned by roll scrub cleaning, pencil scrub cleaning and two-fluid jet cleaning, followed by drying. First, as in the above-described cleaning process shown in FIG. 1, roll scrub cleaning of a surface of a substrate after polishing is carried out with the use of an acidic liquid chemical, followed by rinsing the surface of the substrate to remove the cleaning liquid (liquid chemical) remaining on the surface of the substrate. Next, as in the above-described cleaning process, pencil scrub cleaning of the surface of the substrate is carried out with the use of an acidic liquid chemical, followed by rinsing of the surface of the substrate to remove the cleaning liquid (liquid chemical) remaining on the surface of the substrate. Next, non-contact two-fluid jet cleaning of the surface of the substrate is carried out by jetting a two-fluid jet flow, using acidic carbonated water as a cleaning liquid, toward the surface of the substrate, followed by rinsing the surface of the substrate to remove the cleaning liquid (carbonated water) remaining on the surface of the substrate. The substrate after the two-fluid jet cleaning is dried, e.g., by spin-drying.

PRIOR ART DOCUMENTS

Patent document 1: Japanese Patent Laid-Open Publication No. 2009-231628
Patent document 2: Japanese Patent Laid-Open Publication No. 2009-238896
Patent document 3: Japanese Patent Laid-Open Publication No. 2010-238850

SUMMARY OF THE INVENTION

Two-fluid jet cleaning generally uses acidic carbonated water, comprising pure water or ultrapure water containing dissolved $CO_2$ gas, as a cleaning liquid for antistatic purposes. Therefore, when a surface of a substrate after polishing, having copper interconnects embedded in an insulator and exposed on the surface of the substrate, is cleaned by two-fluid jet cleaning using carbonated water as a cleaning liquid, the copper interconnects can be corroded by the acidic carbonated water. In the production of a next-generation device with copper interconnects, an alkaline cleaning liquid will be mainly used instead of an acidic cleaning liquid so as to prevent corrosion of the copper interconnects.

As described above, in cleaning of a substrate for a leading-edge copper/low-k film device, it is difficult to avoid corrosion of copper interconnects when the substrate is cleaned by a conventional common cleaning method, especially a two-fluid jet cleaning method using carbonated water (acidic cleaning liquid).

In particular, when a copper surface Wf of a substrate W is finally cleaned by two-fluid jet cleaning, followed by rinsing and spin-drying, as shown in FIG. 2, acidic carbonated water CW is likely to remain around particles (defects) P which have not been cleaned off and remain on the surface Wf of the substrate W, as shown in FIG. 3A. Oxygen ($O_2$) in the air dissolves in the residual carbonated water CW, which may cause copper corrosion C around the particles P in the surface Wf of the substrate W after drying, as shown in FIG. 3B.

FIG. 4 shows an SEM image of a copper surface of a substrate after cleaning of the surface of the substrate, carried out by the cleaning process shown in FIG. 2. As can be seen in FIG. 4, surface roughening due to copper corrosion is observed around particles (defects) in the copper surface, thus indicating corrosion of the copper surface.

A demand therefore exists for the development of a substrate cleaning method which can clean a surface of a substrate with high cleaning performance by employing two-fluid jet cleaning using carbonated water as a cleaning liquid, and which can prevent corrosion of copper interconnects.

The present invention has been made in view of the above situation. It is therefore an object of the present invention to provide a substrate cleaning method which, through optimization of a method for cleaning a surface of a substrate, e.g. for a next-generation device with copper interconnects, using two-fluid jet cleaning, can prevent corrosion of copper interconnects even when the cleaning method, which uses two-fluid jet cleaning, is used for cleaning of a surface of a substrate after polishing.

In order to achieve the above object, the present invention provides a substrate cleaning method comprising: carrying out primary cleaning of a surface of a substrate by scrub cleaning using a neutral or alkaline liquid chemical as a cleaning liquid; carrying out finish cleaning of the surface of the substrate by two-fluid jet cleaning which cleans the surface of the substrate in a non-contact manner by jetting carbonated water, comprising pure water or ultrapure water containing dissolved $CO_2$ gas, from a two-fluid nozzle toward the surface of the substrate; and subsequently carrying out final finish cleaning of the surface of the substrate by scrub cleaning using a neutral or alkaline liquid chemical as a cleaning liquid, and then drying the surface of the substrate.

By carrying out final finish cleaning of a surface of a substrate by scrub cleaning using a neutral or alkaline liquid chemical as a cleaning liquid after finish cleaning of the surface of the substrate by two-fluid jet cleaning using carbonated water which would cause copper corrosion, carbonated water remaining on the surface of the substrate can be removed quickly, i.e. before oxygen in the air dissolves in the residual acidic carbonated water. This makes it possible to effectively prevent the occurrence of copper corrosion caused by two-fluid jet cleaning while achieving the particle removal effect of two-fluid jet cleaning.

In a preferred aspect of the present invention, the primary cleaning is roll scrub cleaning performed by rubbing a roll cleaning member against the surface of the substrate, and the final finish cleaning is pencil scrub cleaning performed by rubbing a pencil-type cleaning member against the surface of the substrate.

Thus, the final finish cleaning is carried out by pencil scrub cleaning after carrying out the primary cleaning by roll scrub cleaning and carrying out the finish cleaning by two-fluid jet cleaning. This can reduce the burden on pencil scrub cleaning, making it possible to maintain the pencil scrub cleaning performance over a long period of time and extend the lifetime of a pencil-type cleaning member.

In a preferred aspect of the present invention, copper interconnects, embedded in an insulator with a surface exposed, are formed in the surface of the substrate.

This can effectively prevent corrosion of the copper interconnects caused by the carbonated water used in the two-fluid jet cleaning.

According to the substrate cleaning method of the present invention, carbonated water, remaining on a surface of a substrate after its use in two-fluid jet finish cleaning, can be removed quickly, i.e. before oxygen in the air dissolves in the residual acidic carbonated water. This makes it possible to effectively prevent the occurrence of copper corrosion caused by two-fluid jet cleaning while achieving the particle removal effect of two-fluid jet cleaning.

BRIEF DESCRIPTION OF THE DRAWINGS

FIGS. 16A and 16B are diagrams illustrating the mechanism of prevention of corrosion of a copper surface of a substrate upon cleaning of the surface of the substrate, carried out by the cleaning process shown in FIG. 15;

DETAILED DESCRIPTION OF THE PREFERRED EMBODIMENTS

Preferred embodiments of the present invention will now be described with reference to the drawings.

Figure 1:
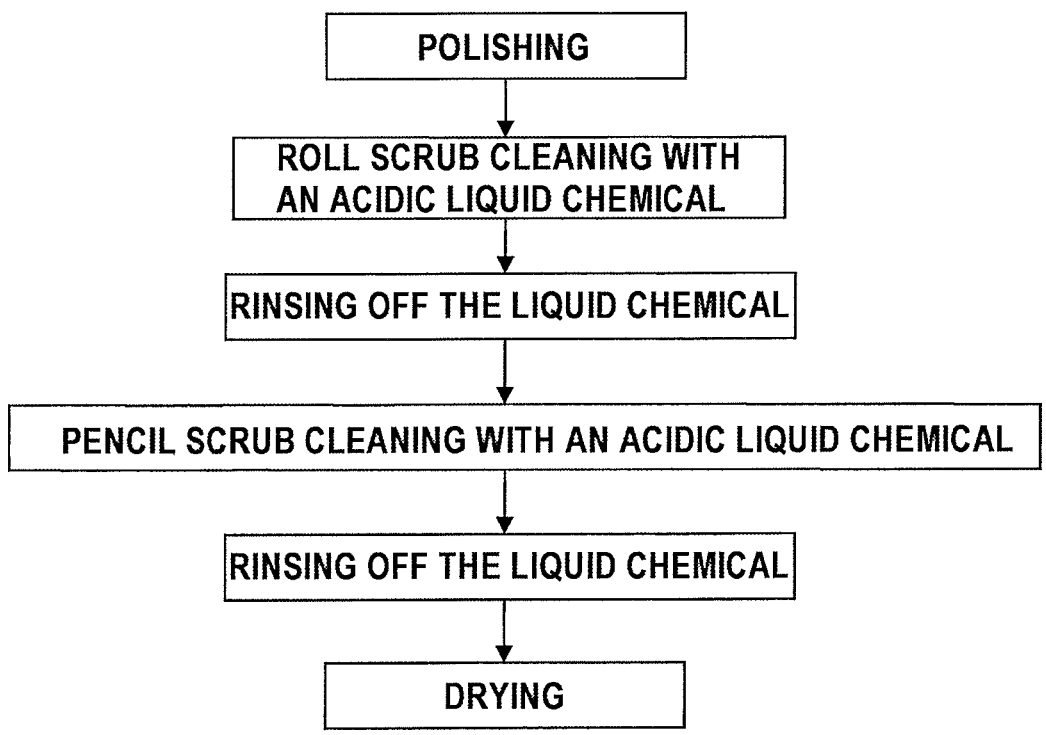
FIG. 1 is a flow chart showing an exemplary cleaning process in which a surface of a substrate after polishing is successively cleaned by roll scrub cleaning and pencil scrub cleaning, followed by drying.
Figure 2:
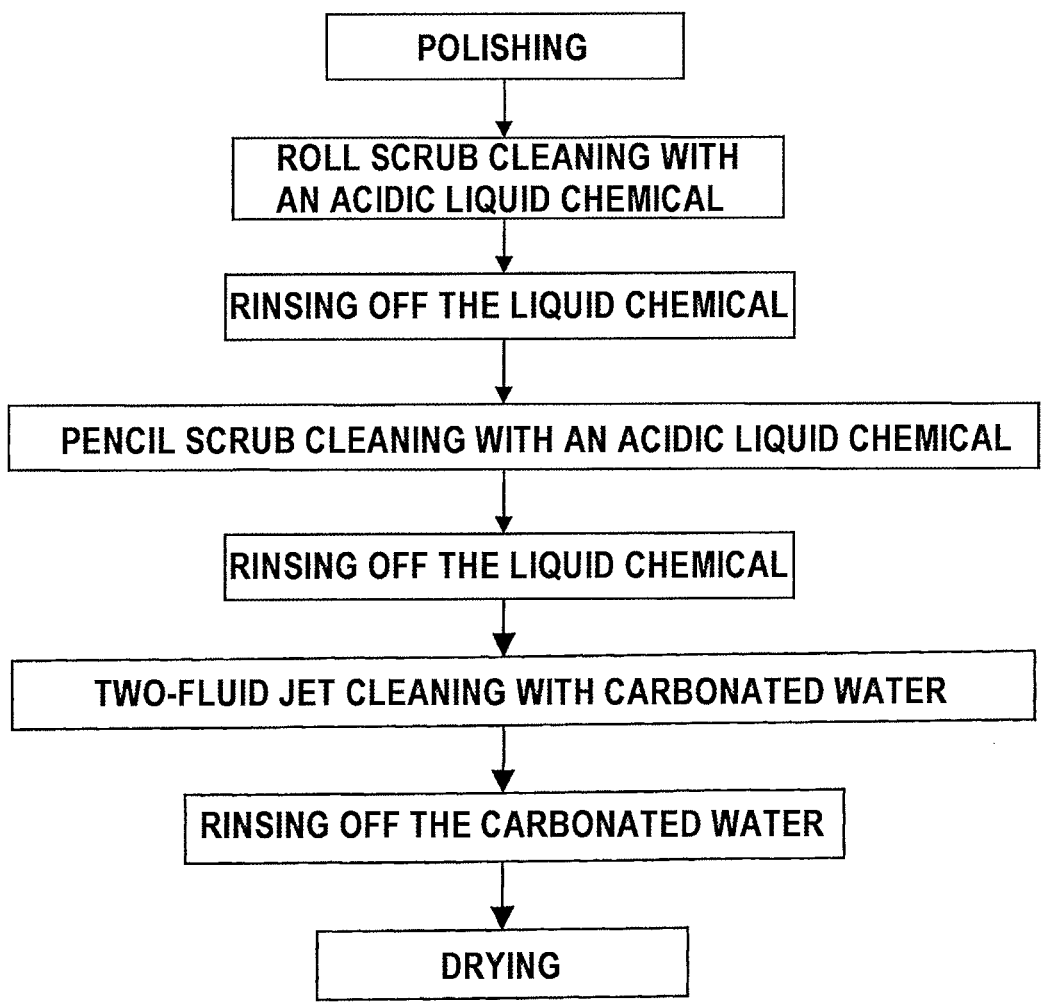
FIG. 2 is a flow chart showing an exemplary cleaning process in which a surface of a substrate after polishing is successively cleaned by roll scrub cleaning, pencil scrub cleaning and two-fluid jet cleaning, followed by drying.
Figure 3A:
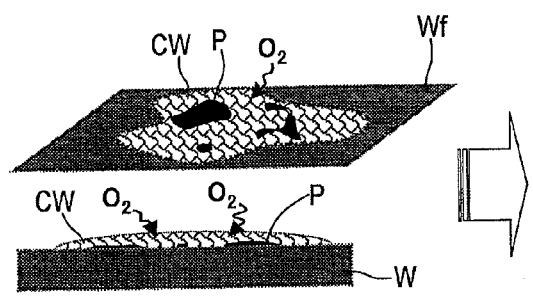
FIGS. 3A and 3B are diagrams illustrating the mechanism of the occurrence of corrosion of a copper surface of a substrate upon cleaning of the surface of the substrate, carried out by the cleaning process shown in FIG. 2.
Figure 3B:
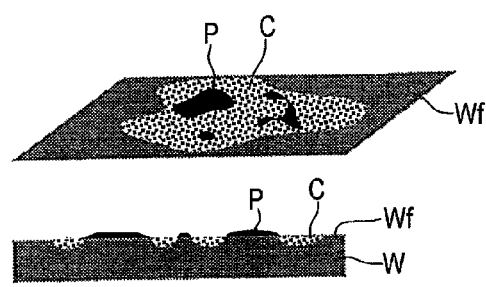
Figure 4:
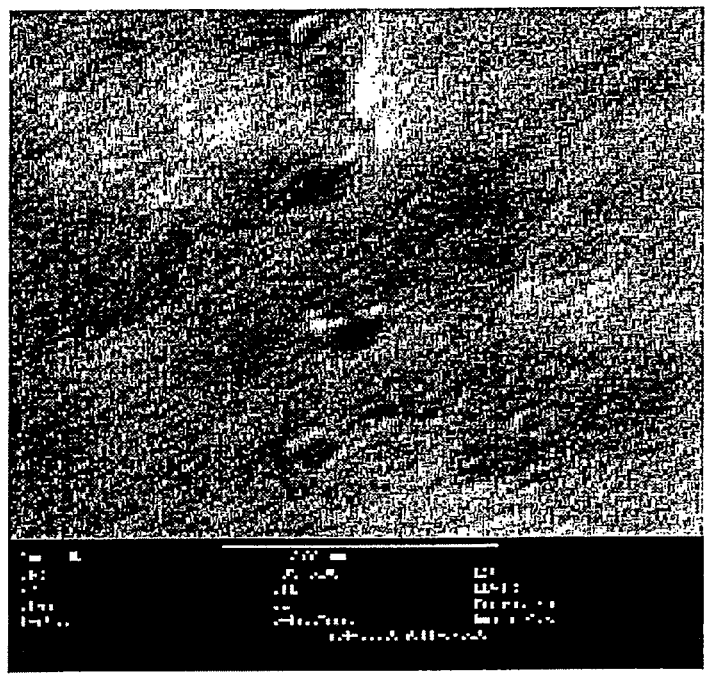
FIG. 4 is a diagram showing an SEM image of a copper surface of a substrate after cleaning of the surface of the substrate, carried out by the cleaning process shown in FIG. 2.
Figure 5:
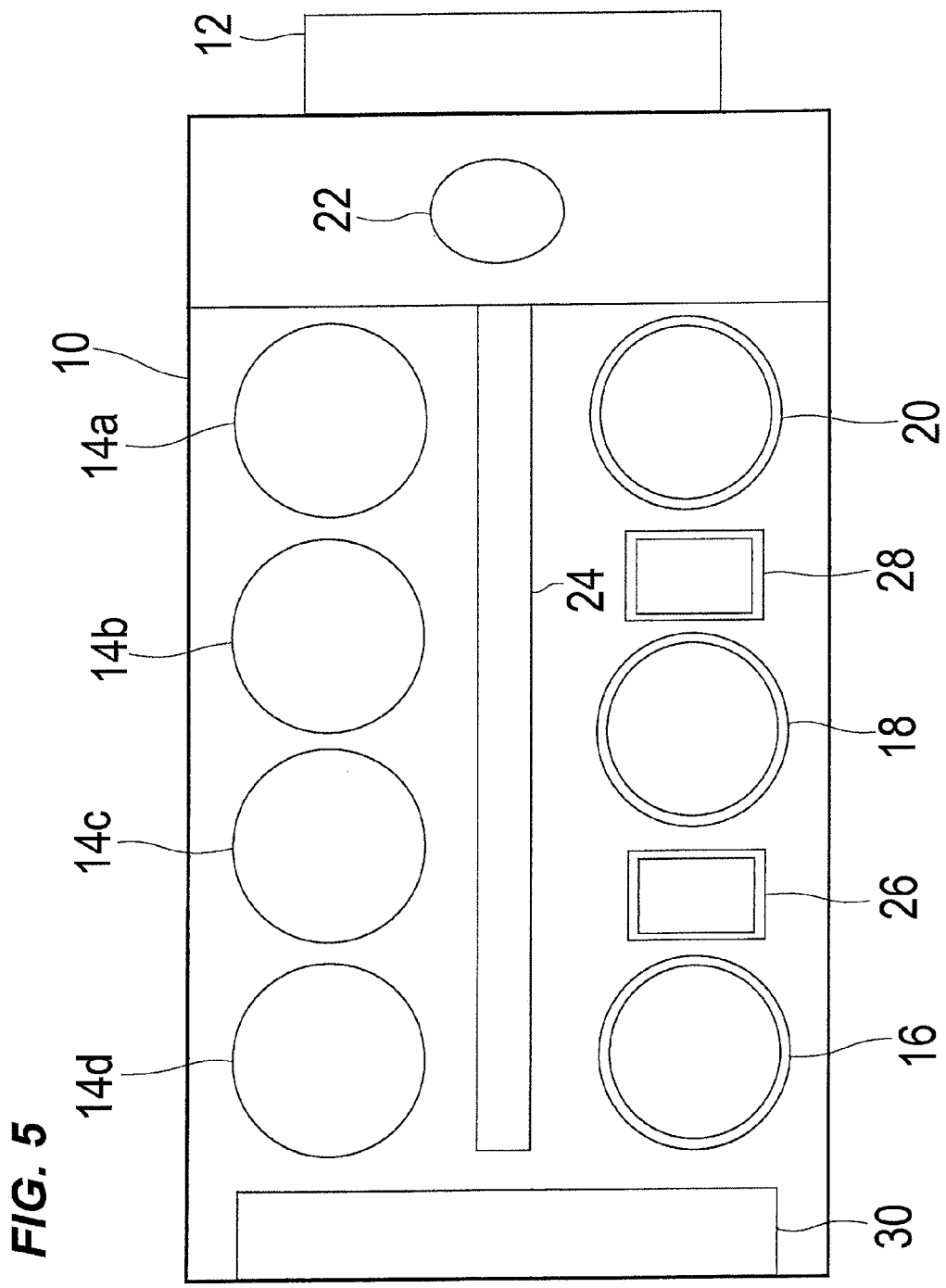
FIG. 5 is a plan view showing the overall construction of a polishing apparatus which can use a substrate cleaning method according to the present invention.

FIG. 5 is a plan view showing the overall construction of a polishing apparatus which can use a substrate cleaning method according to the present invention. As shown in FIG. 5, this polishing apparatus includes a generally-rectangular housing 10, and a loading port 12 for placing thereon a substrate cassette for storing a large number of substrates, such as semiconductor wafers. The loading port 12 is disposed adjacent to the housing 10 and can be mounted with an open cassette, a SMIF (standard manufacturing interface) or a FOUP (front opening unified pod). A SMIF and a FOUP are each an airtight container which houses therein a substrate cassette and which, by covering it with a partition wall, can keep the internal environment independent of the external environment.

In the housing 10 are housed four polishing units 14a-14d, a first cleaning unit 16 and a second cleaning unit 18 each for cleaning a substrate after polishing, and a drying unit 20 for drying a substrate after cleaning. The polishing units 14a-14d are arranged in the longitudinal direction of the polishing apparatus, and the cleaning units 16, 18 and the drying unit 20 are also arranged in the longitudinal direction of the polishing apparatus. The first cleaning unit 16 is used for primary cleaning of the surface of the substrate and the second cleaning unit 18 is used for performing finish cleaning and final finish cleaning of the surface of the substrate.

A first substrate transport robot 22 is disposed in an area surrounded by the loading port 12, the polishing unit 14a located near the loading port 12, and the drying unit 20. Further, a substrate transport unit 24 is disposed parallel to the polishing units 14a-14d. The first substrate transport robot 22 receives a substrate before polishing from the loading port 12 and transfers the substrate to the substrate transport unit 24, and receives a substrate after drying from the drying unit 20 and returns the substrate to the loading port 12. The substrate transport unit 24 transports a substrate after receiving it from the first substrate transport robot 22, and transfers the substrate between it and one of the polishing units 14a-14d.

Between the first cleaning unit 16 and the second cleaning unit 18 is disposed a second substrate transport robot 26 for transferring a substrate between it and the cleaning units 16, 18. Further, between the second cleaning unit 18 and the drying unit 20 is disposed a third substrate transport robot 28 for transferring a substrate between it and the units 18, 20.

In the housing 10 is also disposed a control section 30 for controlling the operations of the devices of the polishing apparatus. As described below, the control section 30 controls the movement of a swing arm 44 provided in the second cleaning unit 18, thereby controlling the movement speed of a two-fluid nozzle 46.

In this embodiment, the first cleaning unit 16 is a roll cleaning unit which cleans a substrate by rubbing roll cleaning members, which extend longitudinally, against front and rear surfaces of the substrate in the presence of a cleaning liquid.

Figure 6:
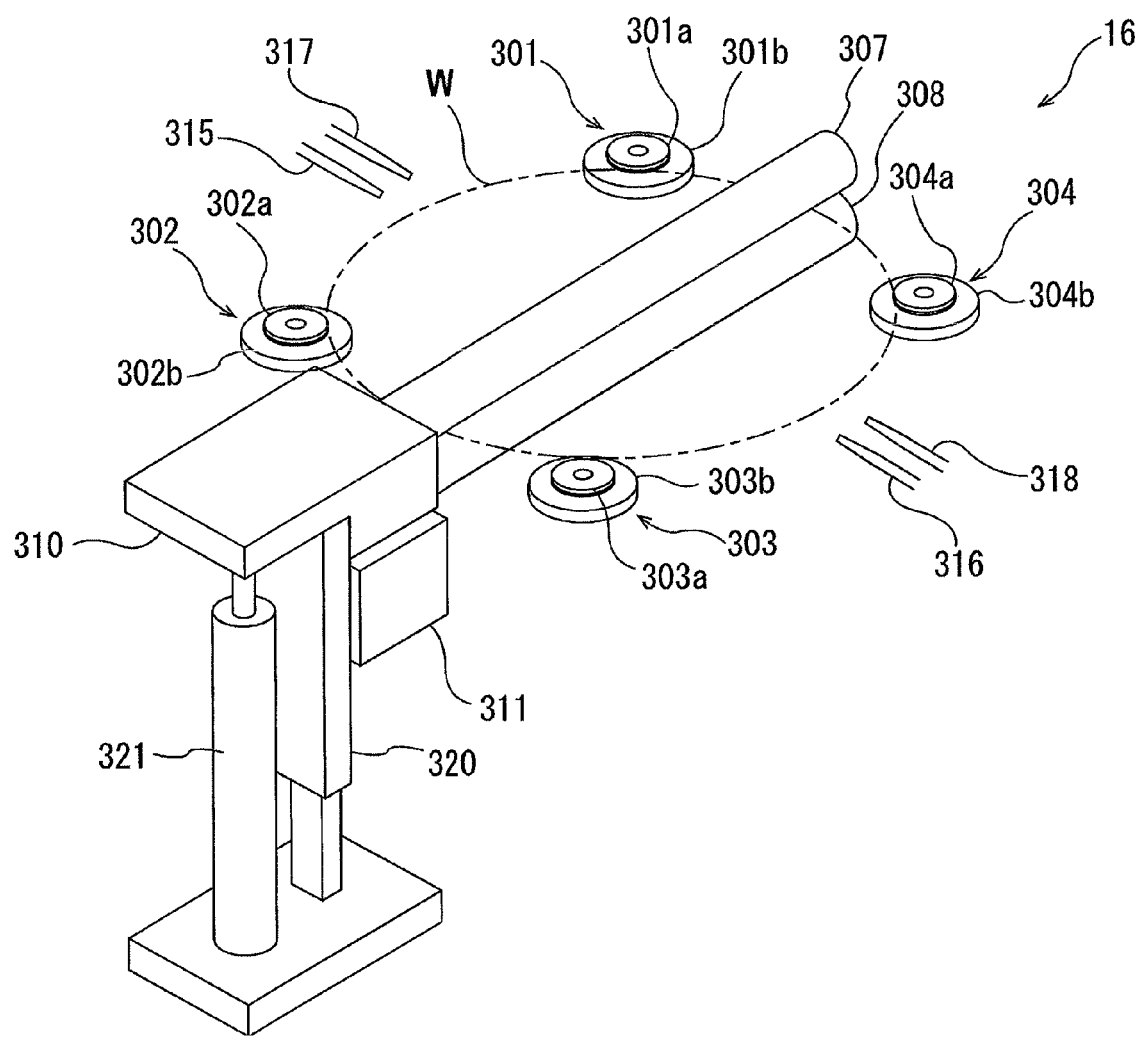
FIG. 6 is a perspective view of a first cleaning unit of the polishing apparatus shown in FIG. 5.

FIG. 6 is a perspective view showing the first cleaning unit 16. As shown in FIG. 6, the first cleaning unit 16 has four rollers 301, 302, 303, 304 configured to horizontally hold and rotate the substrate W with its front surface facing upwardly, roll cleaning members 307, 308 arranged to be brought into contact with the front and rear surfaces of the substrate W, rotating mechanisms 310, 311 configured to rotate the roll cleaning members 307, 308, cleaning liquid supply nozzles 315, 316 configured to supply a cleaning liquid, which is a neutral or alkaline liquid chemical, onto the front and rear surfaces of the substrate W, and rinsing liquid supply nozzles 317, 318 configured to supply an rinse liquid such as pure water onto the front and rear surfaces of the substrate W. The rollers 301, 302, 303, 304 are moved closer to and away from each other by non-illustrated actuators (e.g., pneumatic cylinders).

The rotating mechanism 310 for rotating the upper roll cleaning member 307 is mounted on a guide rail 320 configured to guide a vertical movement of the rotating mechanism 310. Further, the rotating mechanism 310 is supported by an elevating mechanism 321, so that the rotating mechanism 310 and the upper roll cleaning member 307 can be moved in the vertical direction by the elevating mechanism 321. Although not shown in the drawing, the rotating mechanism 311 for rotating the lower roll cleaning member 308 is also supported by a guide rail, so that the rotating mechanism 311 and the lower roll cleaning member 308 can be moved in the vertical direction by an elevating mechanism. A pneumatic cylinder or a motor drive mechanism using a ball screw may be used as the elevating mechanisms.

When the substrate W is carried in and out the first cleaning unit 16, the roll cleaning members 307, 308 are located away from each other. When cleaning the substrate W, the roll cleaning members 307, 308 are moved closer to each other to contact the front and rear surfaces of the substrate W. Forces of the roll cleaning members 307, 308 pressing the front and rear surfaces of the substrate W are controlled by the elevating mechanism 321 and the non-illustrated elevating mechanism. The upper roll cleaning member 307 and the rotating mechanism 310 are supported by the elevating mechanism 321 from below. Therefore, the pressing force of the upper roll cleaning member 307 against the front surface of the substrate W can be adjusted from 0 [N].

The roller 301 has a two-stage structure comprising a holding portion 301a and a shoulder (supporting portion) 301b. The shoulder 301b has a diameter larger than a diameter of the holding portion 301a. The holding portion 301a is formed on the shoulder 301b. The rollers 302, 303, 304 have the same structure as the roller 301. The substrate W is carried into the first cleaning unit 16 by substrate transport unit 24, and is placed onto the shoulders 301b, 302b, 303b, 304b. Then, the rollers 301, 302, 303, 304 are moved toward the substrate W to bring the holding portions 301a, 302a, 303a, 304a into contact with the substrate W, whereby the substrate W is held by the holding portions 301a, 302a, 303a, 304a. At least one of the four rollers 301, 302, 303, 304 is rotated by a rotating mechanism (not shown in the drawing), whereby the substrate W is rotated with its periphery held by the rollers 301, 302, 303, 304. The shoulders 301b, 302b, 303b, 304b comprise tapered surfaces with downward gradient. With this configuration, the substrate W is kept out of contact with the shoulders 301b, 302b, 303b, 304b when the substrate W is held by the holding portions 301a, 302a, 303a, 304a.

Cleaning operation of the front and rear surfaces of the substrate W by the first cleaning unit 16 is performed as follows. First, the substrate W is horizontally held by the rollers 301, 302, 303, 304, and rotated with its front surface facing upwardly. Subsequently, the cleaning liquid, which is a neutral or alkaline liquid chemical, is supplied from the cleaning liquid supply nozzles 315, 316 onto the front and rear surfaces of the substrate W. Then, the roll cleaning members 307, 308 are rotated about their own axes and brought into sliding contact with the front and rear surfaces of the substrate W to thereby perform roll scrub cleaning of the front and rear surfaces of the substrate W. After the roll scrub cleaning, the roll cleaning member 307 is moved upward and the roll cleaning member 308 is moved downward. Then, the rinse liquid (pure water) is supplied from the rinsing liquid supply nozzles 317, 318 onto the front and rear surfaces of the substrate W to rinse off the cleaning liquid (chemical liquid) remaining on the front and rear surfaces of the substrate W.

The second cleaning unit 18 is a cleaning unit which performs finish cleaning of the surface of the substrate by two-fluid jet cleaning and then performs final finish cleaning by pencil scrub cleaning. The drying unit 20 is a spin drying unit which dries a substrate by jetting an IPA vapor from a moving nozzle toward the substrate, and further dries the substrate through centrifugal force by rotating the substrate at a high speed.

Figure 7:
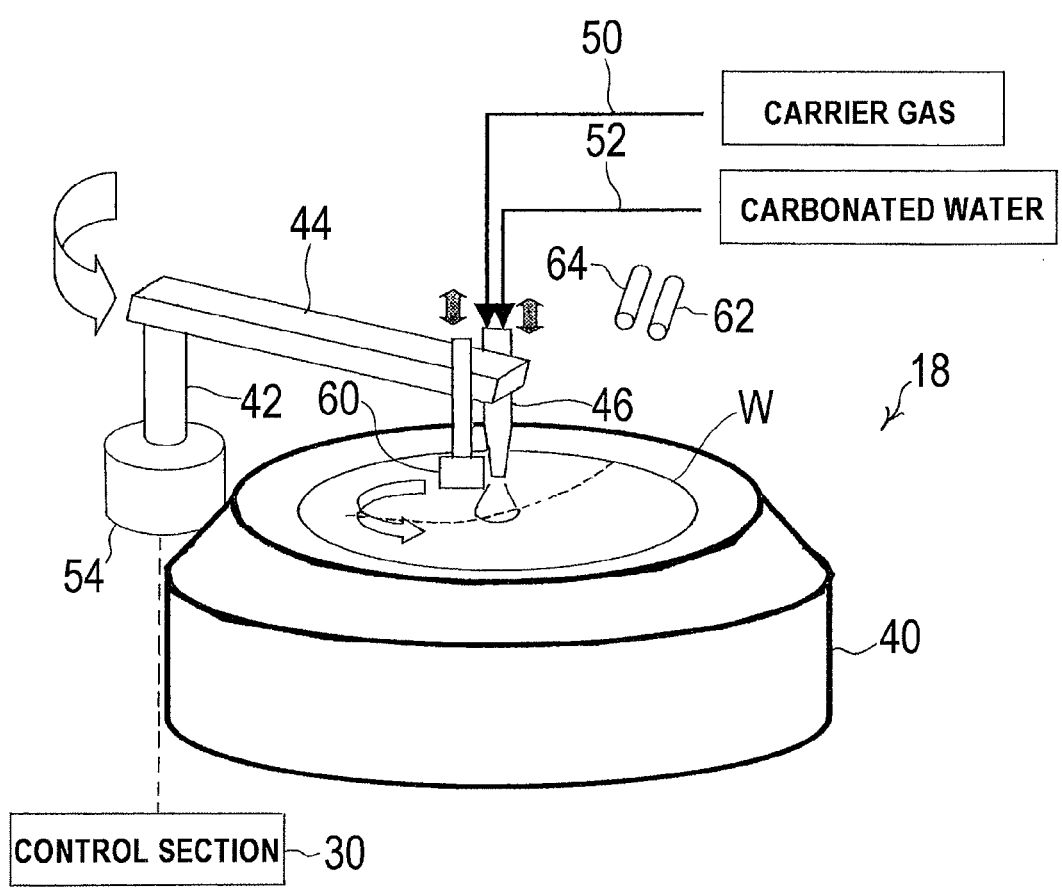
FIG. 7 is a perspective view of a second cleaning unit of the polishing apparatus shown in FIG. 5.
Figure 8:
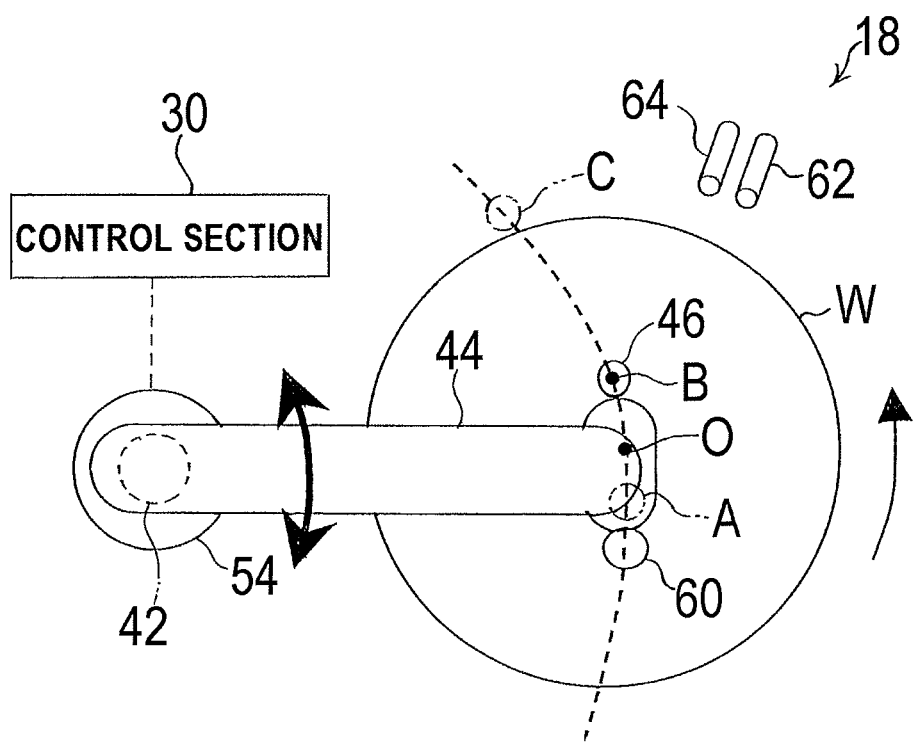
FIG. 8 is a plan view of a main portion of FIG. 7.

FIG. 7 is a schematic perspective view of the second cleaning unit 18 shown in FIG. 5; and FIG. 8 is a plan view showing the main portion of FIG. 7. As shown in FIGS. 7 and 8, the second cleaning unit 18 includes a cleaning tank 40 which surrounds the circumference of a substrate W, which is held, e.g., by not-shown chucks with its surface facing upwardly and horizontally rotates, e.g., by the rotation of the chucks, a rotatable support shaft 42 disposed beside the cleaning tank 40, and a horizontally-extending swing arm 44 coupled, at its base end, to an upper end of the support shaft 42. A two-fluid nozzle 46 is vertically movably mounted to a free end (front end) of the swing arm 44.

To the two-fluid nozzle 46 is connected a carrier gas supply line 50 for supplying a carrier gas, such as $N_2$ gas, and a carbonated water supply line 52 for supplying carbonated water comprising pure water or ultrapure water containing dissolved $CO_2$ gas. A two-fluid jet flow of the carrier gas, containing fine liquid droplets (mist) of the carbonated water, is created by jetting from the two-fluid nozzle 46 a mixture of the carrier gas, such as $N_2$ gas, and the carbonated water supplied into the two-fluid nozzle 46 at a high speed. By allowing the two-fluid jet flow created by the two-fluid nozzle 46 to collide against a surface of a rotating substrate W, particles, etc. can be removed (cleaned) from the surface of the substrate by utilizing a shock wave generated by the collision of the fine liquid droplets against the surface of the substrate.

In this embodiment, carbonated water comprising ultrapure water, from which oxygen is deaerated and contains dissolved $CO_2$ gas, is used as a cleaning liquid. By thus using carbonated water, instead of ultrapure water having high resistivity, as a cleaning liquid of two-fluid jet cleaning, it becomes possible to reduce a fear of electrostatic destruction of a surface to be cleaned, e.g., a surface of an insulating film.

The support shaft 42 is connected to a motor 54 as a drive mechanism for rotating the support shaft 42, thereby swinging the swing arm 44 on the support shaft 42. The rotational speed of the motor 54 is controlled by a signal from the control section 30, whereby the angular velocity of the swing arm 44 and thus the movement speed of the two-fluid nozzle 46 are controlled.

In this embodiment, a pencil-type cleaning member 60, e.g., comprised of a PVA sponge, is rotatably and vertically movably mounted to the front end of the swing arm 44. Further, beside and above the cleaning tank 40 are disposed a rinsing liquid supply nozzle 62 for supplying a rinsing liquid such a pure water to the surface of the rotating substrate W, held, e.g., by the chucks, and a cleaning liquid supply nozzle 64 for supplying the cleaning liquid which is a neutral or alkaline liquid chemical.

In operation, while keeping the lower end of the rotating pencil-type cleaning member 60 in contact with the surface of the rotating substrate W at a predetermined pressure, the pencil-type cleaning member 60 is moved by swinging the swing arm 44 and, at the same time, the cleaning liquid, which is a neutral or alkaline liquid chemical, is supplied to the surface of the substrate W, thereby performing pencil scrub cleaning of the surface of the substrate W. Further, the rinsing liquid is supplied to the surface of the rotating substrate W to rinse off the cleaning liquid (liquid chemical) remaining on the surface of the substrate.

As shown in FIG. 8, as the swing arm 44 moves during cleaning of the surface of the substrate W, the two-fluid nozzle 46 move along an arc-shaped trajectory from an offset position A to a cleaning end position C lying outside the substrate W, passing a position just above the center O of the substrate W and a position just above a predetermined point B at a predetermined distance from the center O. During this cleaning, a two-fluid jet flow of the carrier gas, containing fine liquid droplets (mist) of the carbonated water (cleaning liquid), is continually jetted from the two-fluid nozzle 46 toward the surface of the rotating substrate W. FIG. 8 shows the two-fluid nozzle 46 when it lies at a position just above the predetermined point B.

Cleaning operation of the surface of the substrate by the second cleaning unit 18 is performed as follows. First, the substrate W is horizontally held with its surface facing upwardly and rotated. Then, while moving the two-fluid nozzle 46 from the offset position A to the cleaning end position C, as shown in FIG. 8, a two-fluid jet flow of the carrier gas containing the carbonated water is jetted from the two-fluid nozzle 46 toward the surface of the rotating substrate W at a high speed, whereby performing two-fluid jet cleaning of the surface of the substrate W. Thereafter, the rinsing liquid is supplied to the surface of the rotating substrate W to rinse off the carbonated water remaining on the surface of the substrate.

Next, while keeping the lower end of the rotating pencil-type cleaning member 60 in contact with the surface of the rotating substrate W at a predetermined pressure, the pencil-type cleaning member 60 is moved by swinging the swing arm 44 and, at the same time, the cleaning liquid, which is a neutral or alkaline liquid chemical, is supplied to the surface of the substrate W, thereby performing pencil scrub cleaning of the surface of the substrate W. Then, the rinsing liquid is supplied to the surface of the rotating substrate W to rinse off the cleaning liquid (liquid chemical) remaining on the surface of the substrate.

Figure 9:
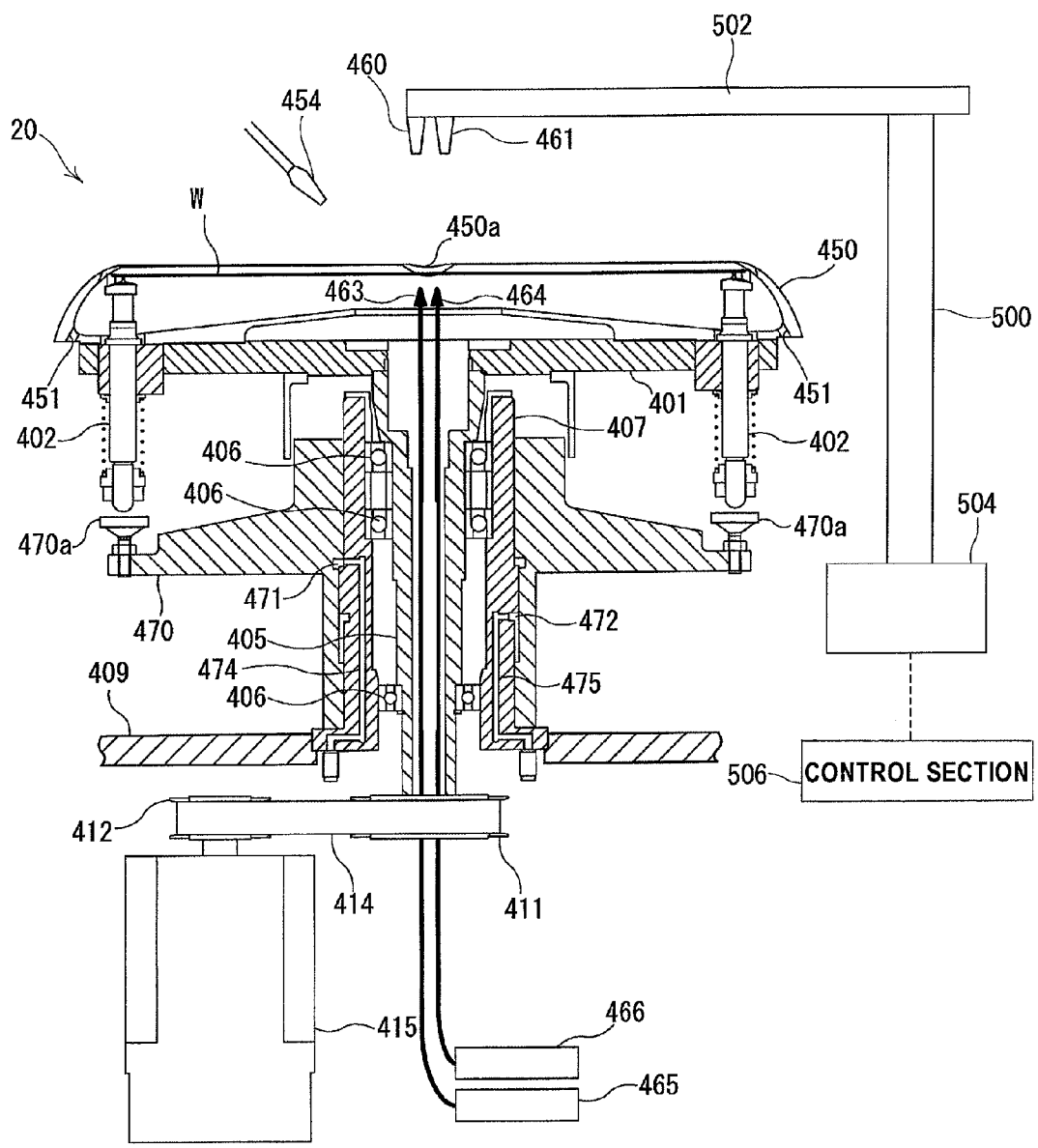
FIG. 9 is a vertical sectional view of a drying unit of the polishing apparatus shown in FIG. 5.
Figure 10:
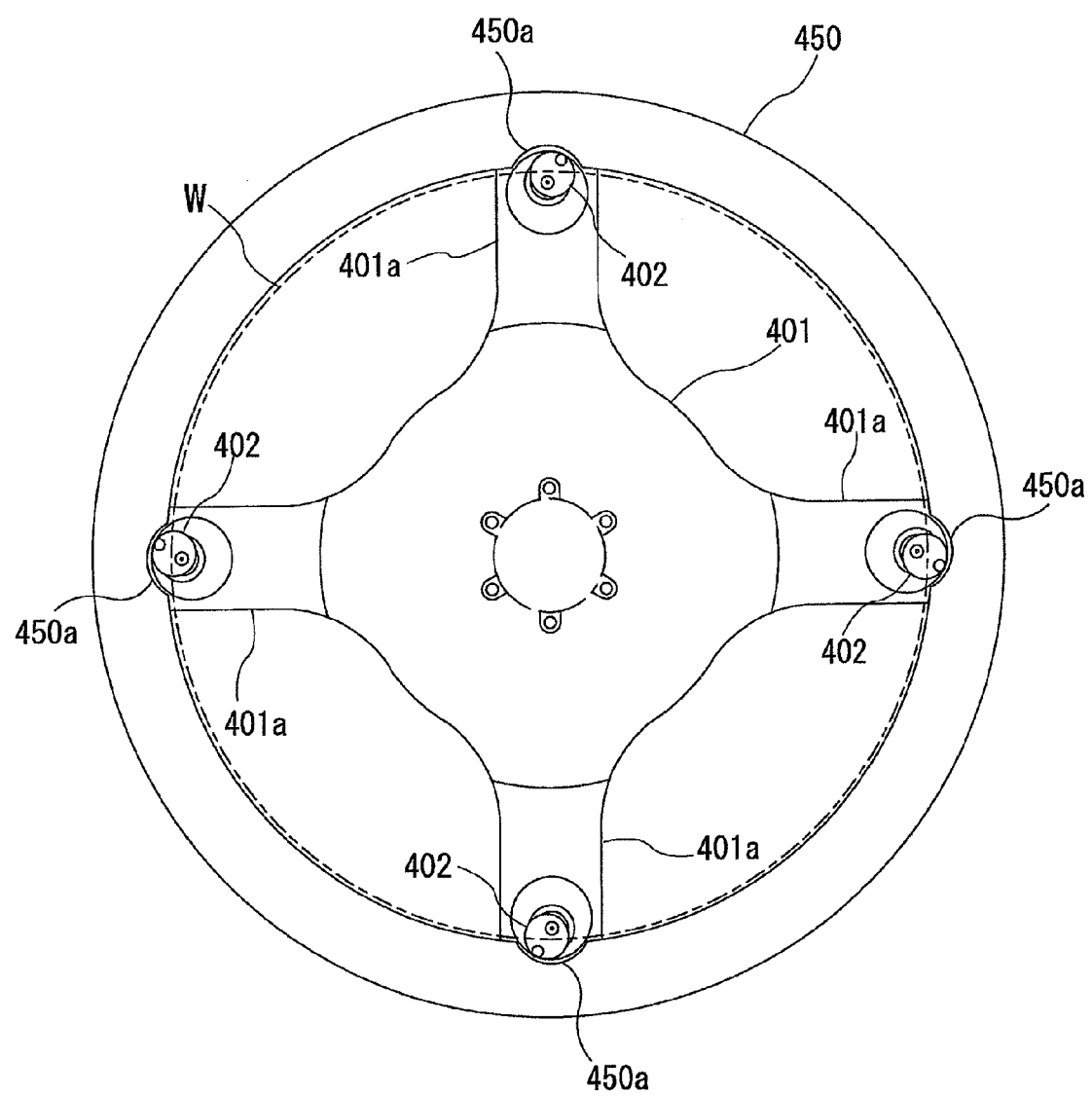
FIG. 10 is a plan view of the drying unit of FIG. 9.

FIG. 9 is a vertical sectional view of the drying unit 20, and FIG. 10 is a plan view of FIG. 9. The drying unit 20 includes a base 401 and four cylindrical substrate-support members 402 which are supported by the base 401. The base 401 is secured to an upper end of a rotational shaft 405, which is rotatably supported by bearings 406. These bearings 406 are secured to an inner surface of a cylindrical member 407 which is in parallel with the rotational shaft 405. A lower end of the cylindrical member 407 is mounted on a mount base 409 and is fixed in position. The rotational shaft 405 is coupled to a motor 415 via pulleys 411, 412 and a belt 414, so that the base 401 is rotated about its own axis by driving the motor 415.

The spin cover 450 is secured to an upper surface of the base 401. FIG. 9 shows a vertical cross section of the spin cover 450. The spin cover 450 is arranged so as to surround the substrate W. The spin cover 450 has the vertical cross section that is inclined radially inwardly and has a smooth curve. An upper end of the spin cover 450 lies in close proximity to the substrate W, and an inside diameter of the upper end of the spin cover 450 is slightly larger than the diameter of the substrate W. The upper end of the spin cover 450 has notches 450a each shaped along the circumferential surface of the substrate-support member 402. The notches 450a are located in positions corresponding to the substrate-support members 402. Drain holes 451, which extend obliquely, are formed in a bottom of the spin cover 450.

A front nozzle 454 for supplying pure water as a rinsing liquid onto the surface (front surface) of the substrate W is arranged above the substrate W. The front nozzle 454 is oriented toward the center of the substrate W. The front nozzle 454 is coupled to a pure water supply source, not shown in the drawings, and supplies the pure water to the center of the front surface of the substrate W. Two parallel fluid nozzles 460, 461 for performing Rotagoni drying are disposed above the substrate W. The fluid nozzle 460 is used for supplying an IPA vapor (a mixture of isopropyl alcohol and an $N_2$ gas) onto the front surface of the substrate W. The fluid nozzle 461 is used for supplying pure water onto the front surface of the substrate W in order to prevent the front surface of the substrate W from being dried.

These fluid nozzles 460, 461 are mounted to a free end (front end) of a swing arm 502 which is coupled to an upper end of a support shaft 500, disposed beside the base 401, and swings by the rotation of the support shaft 500. The support shaft 500 is connected to a motor 504 as a drive mechanism for rotating the support shaft 500, thereby swinging the swing arm 502 on the support shaft 500. The rotational speed of the motor 504 is controlled by a signal from the control section 506, whereby the angular velocity of the swing arm 502 and thus the movement speed of the fluid nozzles 460, 461 are controlled.

The rotational shaft 405 houses therein a back nozzle 463 coupled to a pure water supply source 465 and a gas nozzle 464 coupled to a drying-gas supply source 466. The pure water supply source 465 stores pure water as a rinsing liquid therein and supplies the pure water through the back nozzle 463 to a rear surface of the substrate W. The drying-gas supply source 466 stores an $N_2$ gas or dry air as a drying gas therein, and supplies the drying gas through the gas nozzle 464 to the rear surface of the substrate W.

A lifting mechanism 470 for elevating the substrate-support members 402 is provided around the cylindrical member 407. This lifting mechanism 470 is configured to be able to slide in the vertical direction relative to the cylindrical member 407. The lifting mechanism 470 includes contact plates 470a arranged to be brought into contact with lower ends of the substrate-support members 402. A first gas chamber 471 and a second gas chamber 472 are formed between an outer circumferential surface of the cylindrical member 407 and an inner circumferential surface of the lifting mechanism 470. The first gas chamber 471 and the second gas chamber 472 are in fluid communication with a first gas passage 474 and a second gas passage 475, respectively. The first gas passage 474 and the second gas passage 475 have their ends which are coupled to a pressurized-gas supply source (not shown in the drawing). When pressure in the first gas chamber 471 is increased higher than pressure in the second gas chamber 472, the lifting mechanism 470 is elevated. On the other hand, when pressure in the second gas chamber 472 is increased higher than pressure in the first gas chamber 471, the lifting mechanism 470 is lowered. In FIG. 9, the lifting mechanism 470 is in the lowered position.

Figure 11:
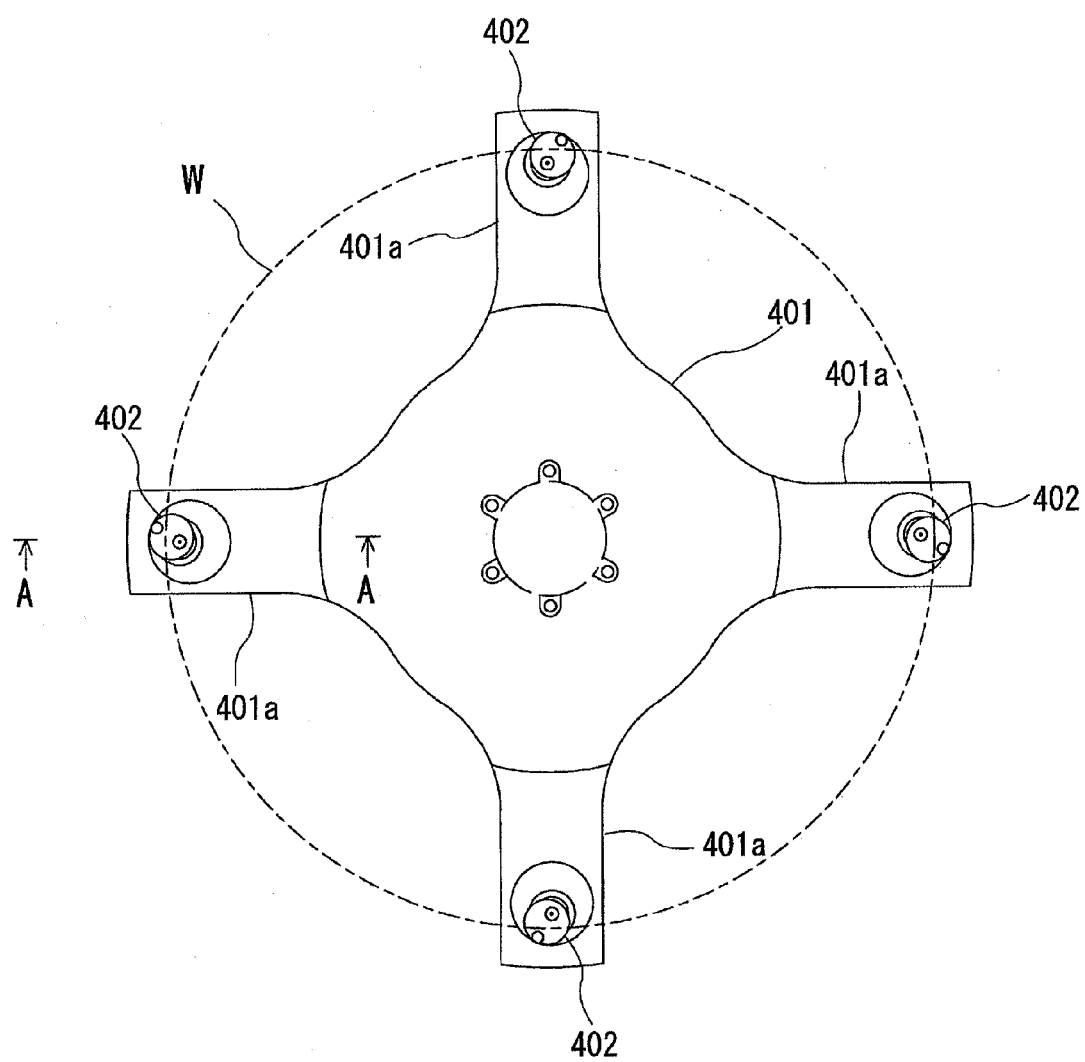
FIG. 11 is a plan view of a base shown in FIG. 9.
Figure 12A:
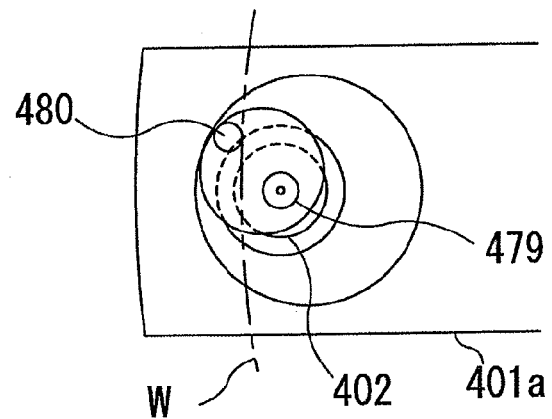
FIG. 12A is a plan view showing part of a substrate-support member and the base shown in FIG. 11.
Figure 12B:
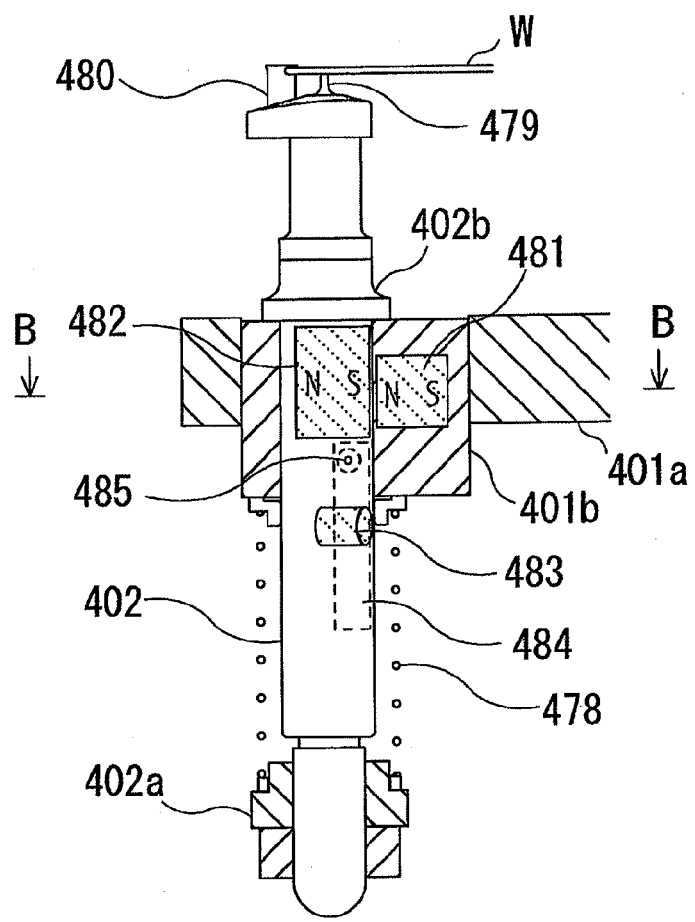
FIG. 12B is a cross-sectional view taken along line A-A of FIG. 11.
Figure 12C:
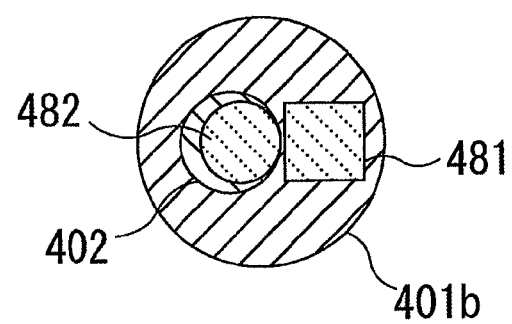
FIG. 12C is a cross-sectional view taken along line B-B of FIG. 12B.

FIG. 11 is a plan view of the base 401 shown in FIG. 9. As shown in FIG. 11, the base 401 includes four arms 401a, and the substrate-support members 402 are vertically movably supported by tip ends of the arms 401a. FIG. 12A is a plan view showing part of the substrate-support member 402 and the base 401 shown in FIG. 11, FIG. 12B is a cross-sectional view taken along line A-A of FIG. 11, and FIG. 12C is a cross-sectional view taken along line B-B of FIG. 12B. The arm 401a of the base 401 has a holder 401b configured to slidably hold the substrate-support member 402. This holder 401b may be formed integrally with the arm 401a. A vertically-extending through-hole is formed in the holder 401b, and the substrate-support member 402 is inserted in this through-hole. The through-hole has a diameter slightly larger than a diameter of the substrate-support member 402. Therefore, the substrate-support member 402 is movable in the vertical direction relative to the base 401, and the substrate-support member 402 is rotatable about its own axis.

A spring support 402a is attached to a lower portion of the substrate-support member 402. A spring 478 is disposed around the substrate-support member 402, and the spring 478 is supported by the spring support 402a. An upper end of the spring 478 presses the holder 401b (which is part of the base 401). Therefore, the spring 478 exerts a downward force on the substrate-support member 402. A stopper 402b is formed on a circumferential surface of the substrate-support member 402. This stopper 402b has a diameter larger than the diameter of the through-hole. Therefore, a downward movement of the substrate-support member 402 is limited by the stopper 402b, as shown in FIG. 12B.

A support pin 479, on which the substrate W is to be placed, and a cylindrical clamp 480 as a substrate holding portion to be brought into contact with the periphery of the substrate W are provided on an upper end of the substrate-support member 402. The support pin 479 is arranged on the axis of the substrate-support member 402. On the other hand, the clamp 480 is arranged away from the axis of the substrate-support member 402. Therefore, as the substrate-support member 402 rotates, the clamp 480 makes revolutions around the axis of the substrate-support member 402. In order to prevent electrostatic charge, substrate-contacting portions are preferably made from a conductive material (preferably iron, aluminum, SUS) or carbon resin (e.g., PEEK or PVC).

A first magnet 481 is attached to the holder 401b of the base 401 so as to face a side surface of the substrate-support member 402. On the other hand, a second magnet 482 and a third magnet 483 are provided in the substrate-support member 402. The second magnet 482 and the third magnet 483 are arranged away from each other in the vertical direction. Neodymium magnet is preferably used as the first, second, and third magnets 481, 482, 483.

Figure 13:
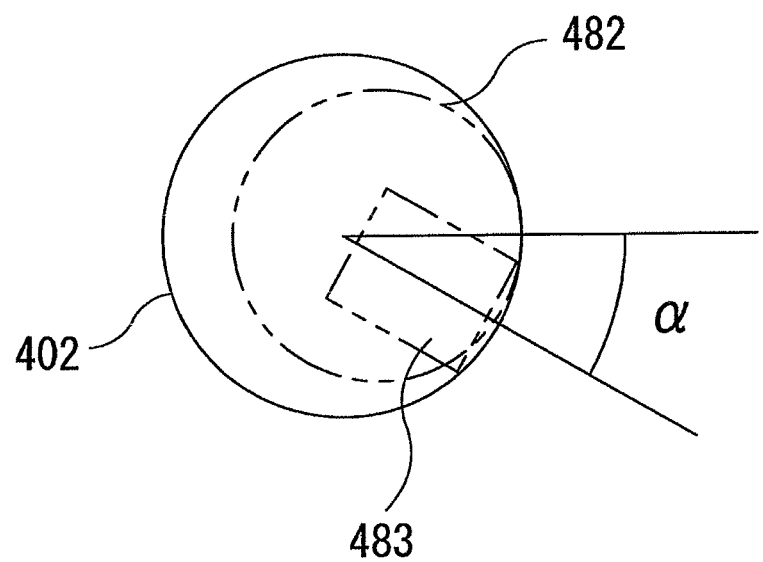
FIG. 13 is a schematic view showing an arrangement of a second magnet and a third magnet, as viewed from the axial direction of the substrate-support member.

FIG. 13 is a schematic view showing an arrangement of the second magnet 482 and the third magnet 483, as viewed from the axial direction of the substrate-support member 402. As shown in FIG. 13, the second magnet 482 and the third magnet 483 are arranged in different positions with respect to the circumferential direction of the substrate-support member 402. Specifically, a line connecting the center of the second magnet 482 and the center of the substrate-support member 402 and a line connecting the center of the third magnet 483 and the center of the substrate-support member 402 cross at a predetermined angle of α, as viewed from the axial direction of the substrate-support member 402.

When the substrate-support member 402 is in the lowered position shown in FIG. 12B, the first magnet 481 and the second magnet 482 face each other. At this time, an attractive force acts between the first magnet 481 and the second magnet 482. This attractive force generates a force of rotating the substrate-support member 402 about its own axis in a direction such that the clamp 480 presses the periphery of the substrate W. Accordingly, the lowered position shown in FIG. 12B is a clamp position in which the substrate W is held (clamped).

It is not necessary that the first magnet 481 and the second magnet 482 always face each other when holding the substrate W, as long as they are close enough to produce a sufficient holding force. For example, even when the first magnet 481 and the second magnet 482 tilt with respect to each other, the magnet force is produced between these magnets, as long as they are close to each other. Therefore, it is not necessary that the first magnet 481 and the second magnet 482 always face each other when holding the substrate W, as long as the magnet force is large enough to rotate the substrate-support member 402 to hold the substrate W.

Figure 14A:
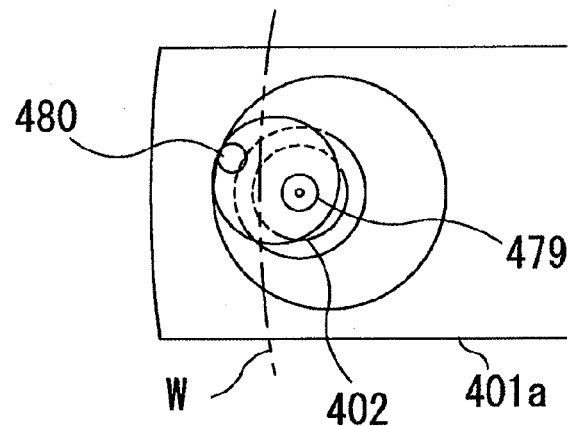
FIG. 14A is a plan view showing part of the substrate-support member and an arm when the substrate-support member is elevated by a lifting mechanism.
Figure 14B:
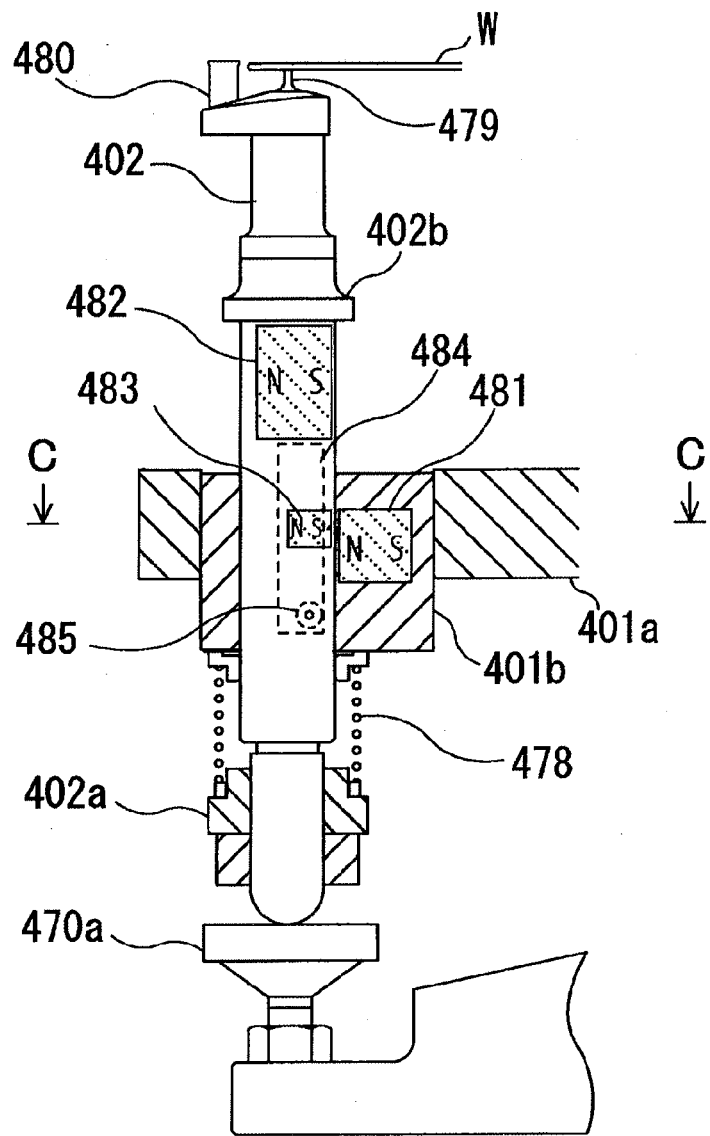
FIG. 14B is a cross-sectional view taken along line A-A of FIG. 8 when the substrate-support member is elevated by the lifting mechanism.
Figure 14C:
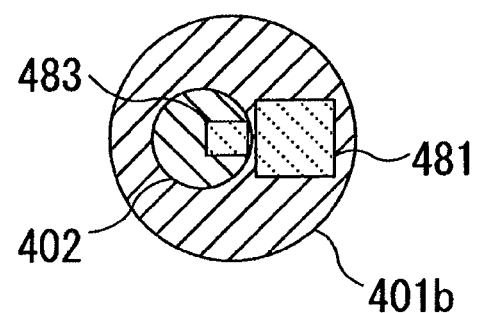
FIG. 14C is a cross-sectional view taken along line C-C of FIG. 14B.

FIG. 14A is a plan view showing part of the substrate-support member 402 and the arm 401a when the substrate-support member 402 is elevated by the lifting mechanism 470, FIG. 14B is a cross-sectional view taken along line A-A of FIG. 11 when the substrate-support member 402 is elevated by the lifting mechanism 470, and FIG. 14C is a cross-sectional view taken along line C-C of FIG. 14B.

When the substrate-support member 402 is elevated by the lifting mechanism 470 to the elevated position shown in FIG. 14B, the first magnet 481 and the third magnet 483 face each other, and the second magnet 482 is away from the first magnet 481. At this time, an attractive force acts between the first magnet 481 and the third magnet 483. This attractive force generates a force of rotating the substrate-support member 402 about its own axis in a direction such that the clamp 480 moves away from the substrate W. Accordingly, the elevated position shown in FIG. 14B is an unclamp position in which the substrate W is released (unclamped). In this case also, it is not necessary that the first magnet 481 and the third magnet 483 always face each other when releasing the substrate W, as long as they are close enough to produce a sufficient force (magnet force) of rotating the substrate-support member 402 in a direction such that the clamp 480 is moved away from the substrate W.

Because the second magnet 482 and the third magnet 483 are arranged in different positions with respect to the circumferential direction of the substrate-support member 402, the rotating force acts on the substrate-support member 402 as the substrate-support member 402 moves up and down. This rotating force provides the clamp 480 with a force of holding the substrate W and a force of releasing the substrate W. Therefore, just by moving the substrate-support member 402 vertically, the clamp 480 can hold and release the substrate W. In this manner, the first magnet 481, the second magnet 482 and the third magnet 483 functions as a holding mechanism (rotating mechanism) for rotating the substrate-support member 402 about its own axis to cause the clamp 480 to hold the substrate W. This holding mechanism (rotating mechanism) is operated by the vertical movements of the substrate-support member 402.

The contact plates 470a of the lifting mechanism 470 are located below the substrate-support members 402. When the contact plates 470a move upward, upper surfaces of the contact plates 470a are brought into contact with the lower ends of the substrate-support members 402, and the substrate-support members 402 are elevated by the contact plates 470a against the pressing forces of the springs 478. The upper surface of each contact plate 470a is a flat surface, and on the other hand, the lower end of each substrate-support member 402 is in the shape of hemisphere. In this embodiment, the lifting mechanism 470 and the springs 478 constitute a drive mechanism for moving the substrate-support members 402 in the vertical direction. It is to be noted that the drive mechanism is not limited to this embodiment. For example, a servomotor may be used as the drive mechanism.

A groove 484 is formed on the side surface of each substrate-support member 402. This groove 484 extends along the axis of the substrate-support member 402, and has an arc-shaped horizontal cross section. A protrusion 485 projecting toward the groove 484 is formed on the arm 401*a* (the holder 401*b* in this embodiment) of the base 401. A tip end of this protrusion 485 lies in the groove 484, and the protrusion 485 roughly engages with the groove 484. The groove 484 and the protrusion 485 are provided for limiting a rotation angle of the substrate-support member 402.

Next, operations of the drying unit 20 with the above-described structures will be described.

First, the substrate W and the spin cover 450 are rotated in unison by the motor 415. In this state, the front nozzle 454 and the back nozzle 463 supply the pure water onto the front surface (upper surface) and the rear surface (lower surface) of the substrate W so as to rinse the substrate W in its entirety with the pure water. The pure water, supplied to the substrate W, spreads over the front and rear surfaces via the centrifugal force, thereby rinsing the entire surfaces of the substrate W. The pure water, which is spun off from the rotating substrate W, is captured by the spin cover 450 and flows into the drain holes 451. When the substrate W is rinsed, the two fluid nozzles 460, 461 are in their given idle positions away from the substrate W.

Then, supply of the pure water from the front nozzle 454 is stopped, and the front nozzle 454 is moved to its given idle position away from the substrate W. The two fluid nozzles 460, 461 are then moved to the offset position (cleaning start position) above the substrate W. While the substrate W is being rotated at a low speed ranging from 30 to 150 min$^{-1}$, the fluid nozzle 460 supplies the IPA vapor and the fluid nozzle 461 supplies the pure water onto the front surface of the substrate W. During this operation, the back nozzle 463 supplies the pure water to the rear surface of the substrate W.

As with the swing arm 44 of the above-described second cleaning unit 18, the rotational speed of the motor 504 is controlled by the control section 504, whereby the angular velocity of the swing arm 502 and thus the movement speed of the two fluid nozzles 460, 461 are controlled, and the two fluid nozzle 460, 461 are simultaneously moved along a radial direction of the substrate W to a position lying outside the substrate W. In this manner, the front surface (upper surface) of the substrate W is dried.

Thereafter, the two fluid nozzles 460, 461 are moved to the their idle positions, and supply of the pure water from the back nozzle 463 is stopped. Then, the substrate W is rotated at a high speed ranging from 1000 to 1500 min$^{-1}$, thereby removing the pure water from the rear surface of the substrate W. During this operation, the gas nozzle 464 supplies the drying gas to the rear surface of the substrate W. In this manner, the rear surface of the substrate W is dried.

A substrate cleaning method according to an embodiment of the present invention as performed by the polishing apparatus shown in FIG. 5 will now be described with reference to the flow chart of FIG. 15.

First, a substrate W is taken out of a substrate cassette in the loading port 12, and the substrate W is transported to one of the polishing units 14*a*-14*d*, where a surface of the substrate W is polished. The substrate W after polishing is transported to the first cleaning unit 16.

As described above, in the first cleaning unit 16, while horizontally rotating the substrate W with its front surface facing upwardly, a cleaning liquid, which is a neutral or alkaline liquid chemical, is supplied to the front and rear surfaces of the substrate W and the roll cleaning members 307, 308, rotating on their axes, are brought into sliding contact with the front and rear surfaces of the substrate W to carry out primary cleaning of the front and rear surfaces of the substrate W by roll scrub cleaning. Thereafter, a rinsing liquid (pure water) is supplied to the front and rear surfaces of the substrate W to rinse off the cleaning liquid (liquid chemical) remaining on the front and rear surfaces of the substrate W.

The substrate W after the primary cleaning is then transported from the first cleaning unit 16 to the second cleaning unit 18.

As described above, in the second cleaning unit 18, while horizontally rotating the substrate W with its front surface facing upwardly and moving the two-fluid nozzle 46 from the offset position A to the cleaning end position C, as shown in FIG. 8, a carrier gas, such as N$_2$ gas, and carbonated water are jetted at a high velocity from the two-fluid nozzle 46 toward the front surface of the substrate W to carry out finish cleaning of the front surface of the substrate W by two-fluid jet cleaning. Thereafter, a rinsing liquid is supplied to the front surface of the substrate W to rinse off carbonated water remaining on the front surface of the substrate W.

Next, while keeping the lower surface of the rotating pencil-type cleaning member 60 in contact with the front surface of the rotating substrate W at a predetermined pressure, the swing arm 44 is swung to move the pencil-type cleaning member 60 and, at the same time, a cleaning liquid, which is a neutral or alkaline liquid chemical, is supplied to the front surface of the substrate W to carry out the final finish cleaning of the front surface of the substrate W by pencil scrub cleaning. Thereafter, a rinsing liquid is supplied to the front surface of the substrate W to rinse off the cleaning liquid (liquid chemical) remaining on the front surface of the substrate W.

The substrate W after the final cleaning step is transported from the second cleaning unit 18 to the drying unit 20, where the substrate W is spin-dried. The substrate W after drying is returned to the substrate cassette in the loading port 12.

In this embodiment, the primary cleaning of a surface of a substrate is carried out by roll scrub cleaning using a neutral or alkaline liquid chemical as a cleaning liquid, and the final finish cleaning of the surface of the substrate is carried out by pencil scrub cleaning using a neutral or alkaline liquid chemical as a cleaning liquid. According to this embodiment, a surface of a substrate after polishing, having copper interconnects embedded in an insulator and exposed on the surface of the substrate, can be cleaned while preventing corrosion of the copper interconnects.

Further, by carrying out the final finish cleaning of the surface of the substrate by scrub cleaning (pencil scrub cleaning) using a neutral or alkaline liquid chemical as a cleaning liquid after the finish cleaning of the surface of the substrate by two-fluid jet cleaning using carbonated water which would cause copper corrosion, carbonated water remaining on the surface of the substrate can be removed quickly, i.e., before oxygen in the air dissolves in the residual acidic carbonated water. This makes it possible to effectively prevent the occurrence of copper corrosion caused by two-fluid jet cleaning while achieving the particle removal effect of two-fluid jet cleaning.

Figure 15:
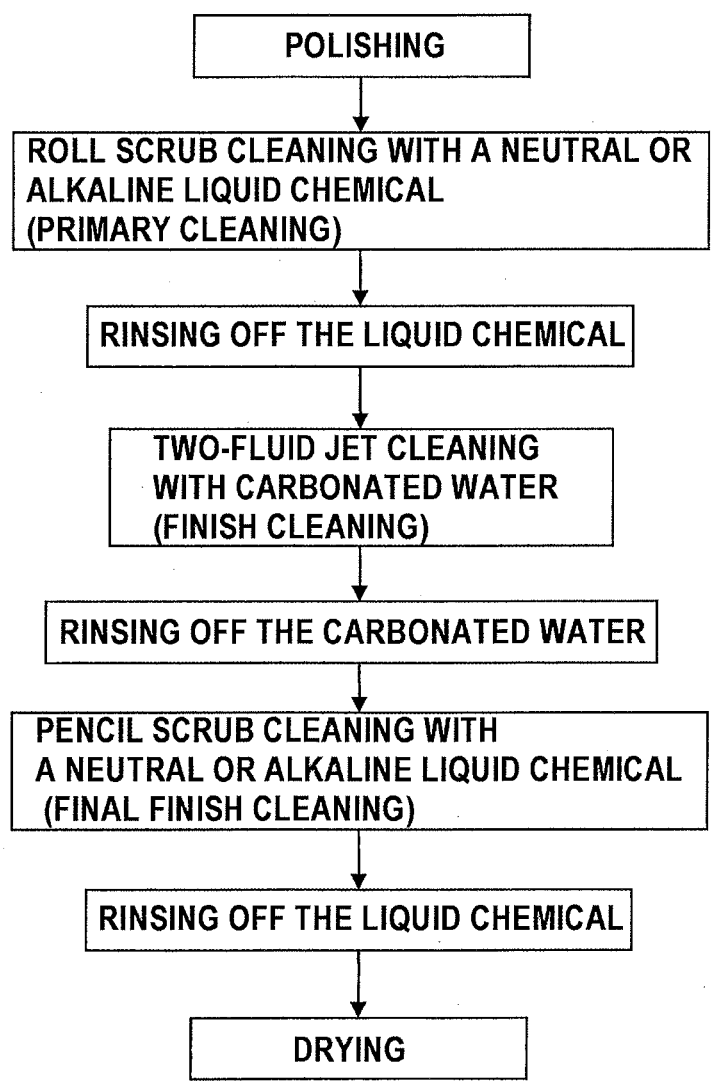
FIG. 15 is a flow chart showing a substrate cleaning method according to an embodiment of the present invention as performed by the polishing apparatus shown in FIG. 5.

FIGS. 16A and 16B are diagrams illustrating the mechanism of prevention of corrosion of a copper surface of a substrate upon cleaning of the surface of the substrate, carried out by the cleaning process shown in FIG. 15. When a copper surface Wf of a substrate W is cleaned by two-fluid jet cleaning, followed by rinsing, acidic carbonated water CW is likely to remain around relatively large particles (defects) $P_1$ and relatively small particles (defects) $P_2$ which have not been cleaned off and remain on the surface Wf of the substrate W, as shown in FIG. 16A. By carrying out the final finish cleaning of the surface of the substrate by pencil scrub cleaning and drying the substrate immediately after the two-fluid jet finish cleaning of the surface of the substrate, the carbonated water CW and the relatively large particles $P_1$, remaining on the surface of the substrate after the two-fluid jet cleaning, can be removed from the surface Wf of the substrate W before oxygen ($O_2$) in the air dissolves in the residual carbonated water CW, as shown in FIG. 16B. This makes it possible to effectively prevent the occurrence of copper corrosion around the relatively small particles $P_2$ in the surface Wf of the substrate W after drying.

Figure 17:
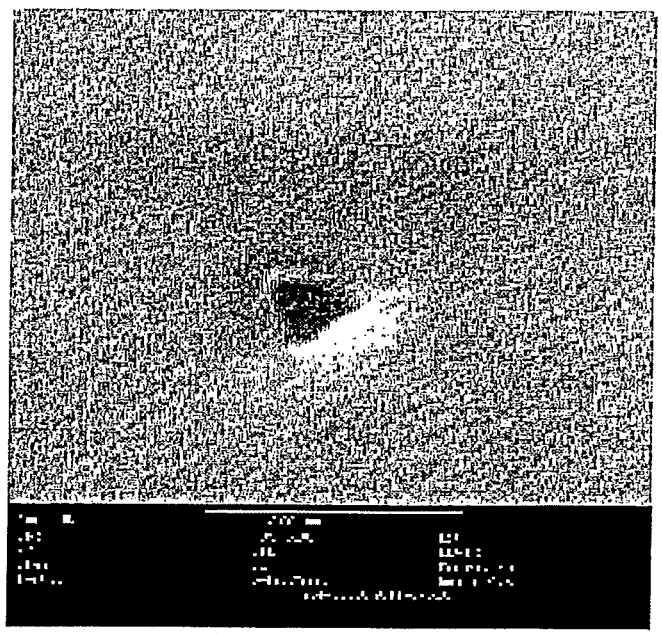
FIG. 17 is a diagram showing an SEM image of a copper surface of a substrate after cleaning of the surface of the substrate, carried out by the cleaning process shown in FIG. 15.

FIG. 17 shows an SEM image of a copper surface of a substrate after cleaning of the surface of the substrate, carried out by the cleaning process shown in FIG. 15. As can be seen in FIG. 17, no surface roughening due to copper corrosion is observed around particles (defects) in the copper surface, thus indicating no corrosion of the copper surface.

Further, the pencil scrub cleaning as the final finish cleaning is carried out after carrying out the primary roll scrub cleaning and the two-fluid jet finish cleaning. This can reduce the burden on the pencil scrub cleaning, making it possible to maintain the pencil scrub cleaning performance over a long period of time and extend the lifetime of the pencil-type cleaning member 60.

Figure 18:
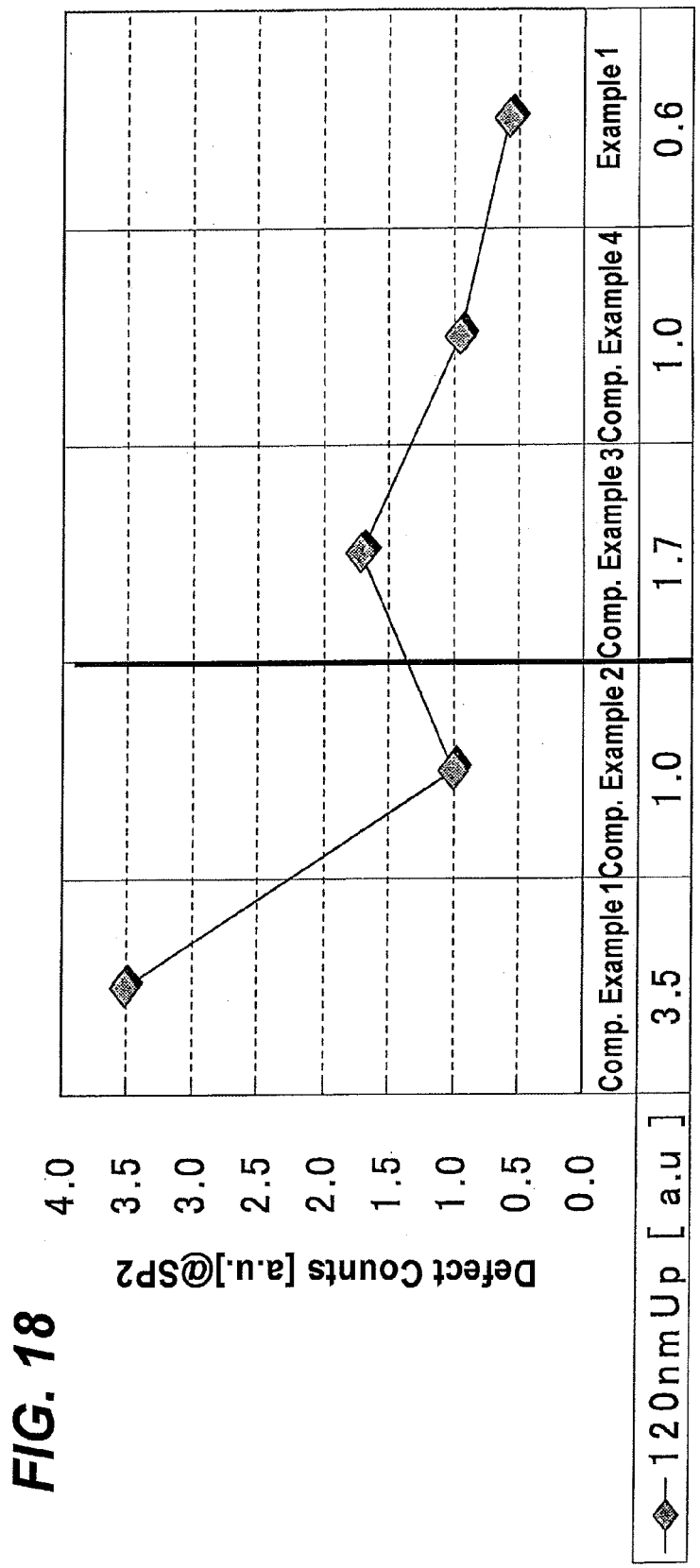
FIG. 18 is a graph showing the results of measurement of the number of particles (defects) having a diameter of not less than 120 nm, remaining on a surface of a low-k film formed in a surface of a substrate after the surface of the substrate is cleaned under various cleaning conditions (Comp. Examples 1 to 4 and Example 1)

FIG. 18 is a graph showing the results of measurement of the number of particles (defects) having a diameter of not less than 120 nm, remaining on a surface of a low-k film formed in a surface of a substrate after the surface of the substrate is cleaned under various cleaning conditions (Comp. Examples 1 to 4 and Example 1). In FIG. 18, the number of particles is expressed in terms of the ratio (arbitrary unit) to the number of particles measured after cleaning in Comparative Example 2.

In Comparative Example 1, the surface of the substrate was cleaned by roll scrub cleaning under low cleaning conditions (the rotational speed of the roll cleaning member: 200 rpm, the rotational speed of the substrate: 50 rpm) using the first cleaning unit 16 shown in FIG. 6, followed by drying. In Comparative Example 2, the surface of the substrate was cleaned by roll scrub cleaning under high cleaning conditions (the rotational speed of the roll cleaning member: 200 rpm, the rotational speed of the substrate: 150 rpm) using the first cleaning unit 16 shown in FIG. 6, followed by drying.

In Comparative Example 3, the surface of the substrate was cleaned by roll scrub cleaning under the same conditions as in Comparative Example 2, and subsequently cleaned by two-fluid jet cleaning using the second cleaning unit 18 shown in FIG. 7, followed by drying. In Comparative Example 4, the surface of the substrate was cleaned by roll scrub cleaning under the same conditions as in Comparative Example 2, subsequently cleaned by pencil scrub cleaning using the second cleaning unit 18 shown in FIG. 7, and subsequently cleaned by two-fluid jet cleaning using the second cleaning unit 18, followed by drying. In Example 1, as shown in FIG. 15, the surface of the substrate was cleaned by roll scrub cleaning (primary cleaning) under the same conditions as in Comparative Example 2, subsequently cleaned by two-fluid jet cleaning (finish cleaning) using the second cleaning unit 18 shown in FIG. 7, and subsequently cleaned by pencil scrub cleaning (final finish cleaning) using the second cleaning unit 18, followed by drying.

The data in FIG. 18 demonstrates that the cleaning method of Example 1 can significantly reduce the number of particles (defects), remaining on the surface of the low-k film after cleaning, as compared to the cleaning methods of Comp. Examples 1 to 4.

Figure 19:
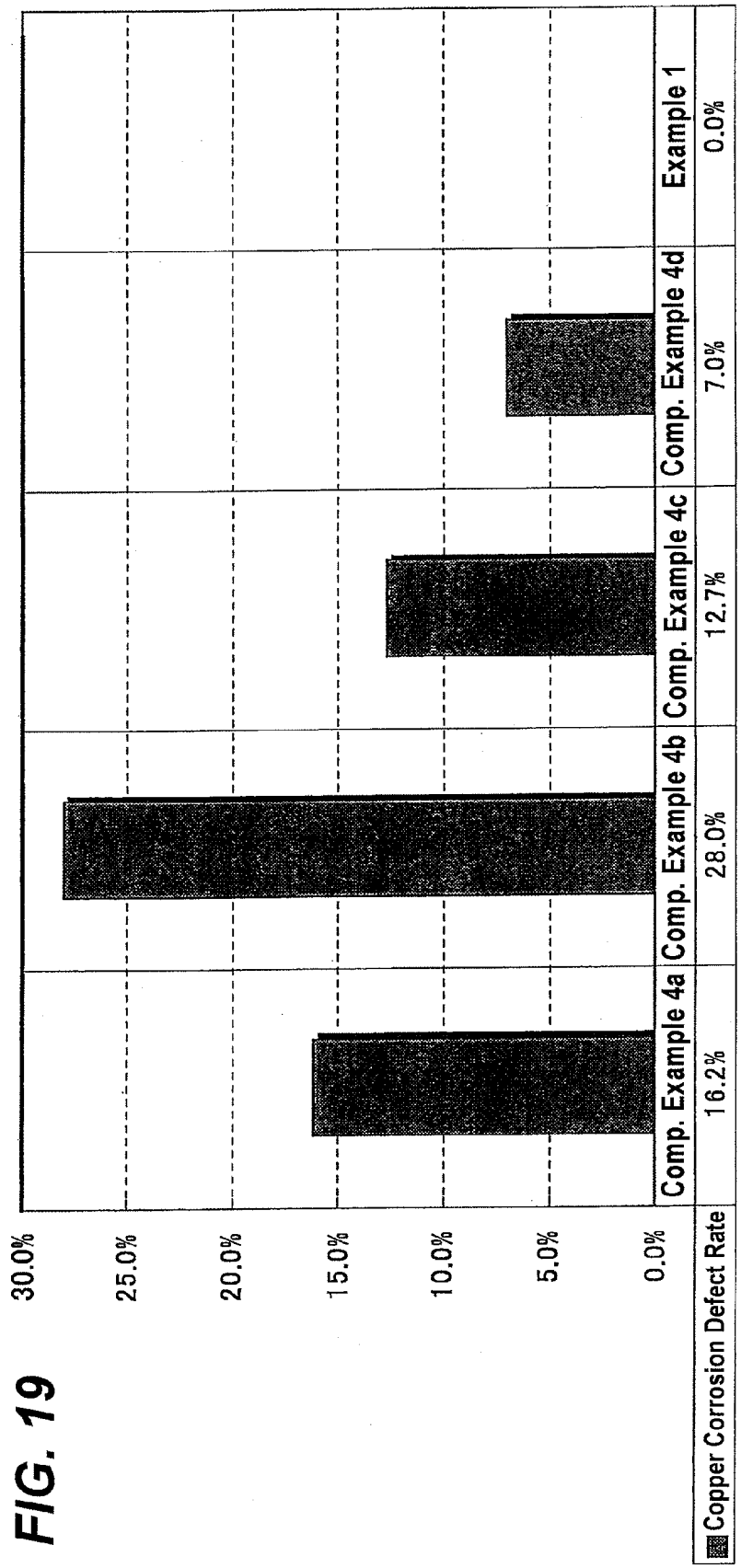
FIG. 19 is a graph showing the results of measurement of the copper corrosion (N≥2) defect rate in a surface of a copper film, as measured after the surface of the copper film is cleaned under varying cleaning conditions (with respect to the swing speed of a swing arm or the manner of scanning a two-fluid nozzle) (Comp. Examples 4a to 4d), or after the surface of the copper film is cleaned in Example 1.

FIG. 19 is a graph showing the results of measurement of the copper corrosion ($N \geq 2$) defect rate in a surface of a copper film, as measured after the surface of the copper film is cleaned by the above-described method of Comp. Example 4 under varying cleaning conditions (with respect to the swing speed of the swing arm or the manner of scanning the two-fluid nozzle) (Comp. Examples 4a to 4d), or after the surface of the copper film is cleaned by the above-described method of Example 1.

As can be seen from FIG. 19, copper corrosion occurs, for all the varying conditions for two-fluid jet cleaning as in Comp. Examples 4a to 4d, if the copper surface is cleaned by the cleaning method in which two-fluid jet cleaning is carried out as the final finish cleaning, followed by drying. On the other hand, copper corrosion can be prevented by cleaning the copper surface by the cleaning method of Example 1 in which pencil scrub cleaning (final finish cleaning) is carried out after two-fluid jet cleaning (finish cleaning), followed by drying.

Figure 20:
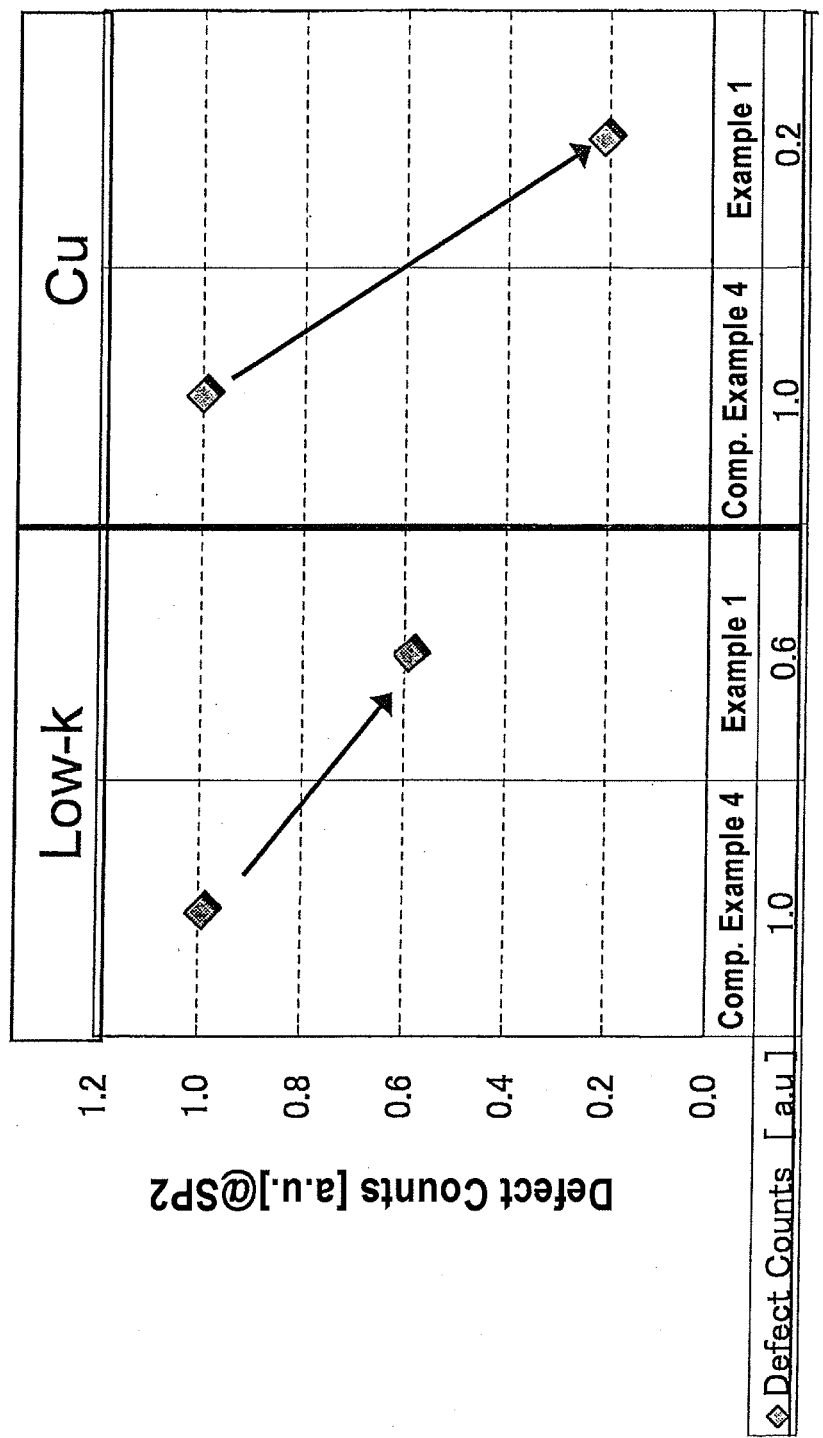
FIG. 20 is a graph showing the results of measurement of the number of particles (defects) having a diameter of not less than 150 nm remaining on a surface of a copper film and the number of particles (defects) having a diameter of not less than 120 nm remaining on a surface of a low-k film, as measured after a surface of a substrate, in which the copper film and the low-k film are co-present, is cleaned in Comp. Example 4 or Example 1.

FIG. 20 is a graph showing the results of measurement of the number of particles (defects) having a diameter of not less than 150 nm remaining on a surface of a copper film and the number of particles (defects) having a diameter of not less than 120 nm remaining on a surface of a low-k film, as measured after a surface of a substrate, in which the copper film and the low-k film are co-present, is cleaned by the cleaning method of Comp. Example 4 or the cleaning method of Example 1. In FIG. 20, the number of particles is expressed in terms of the ratio (arbitrary unit) to the number of particles measured after cleaning in Comp. Example 4.

The data in FIG. 20 demonstrates that the substrate cleaning method of Example 1 can significantly reduce the number of particles (defects), remaining on the surface of the copper film and on the surface of the low-k film after cleaning, as compared to the cleaning methods of Comp. Example 4.

As described hereinabove, in this embodiment, two-fluid jet cleaning is carried out not as a final finish cleaning step but before pencil scrub cleaning which is currently the mainstream method for the final cleaning step in a cleaning process for a substrate after polishing. The cleaning method of this embodiment can effectively prevent the problematic corrosion of copper interconnects while making use of the characteristic features of two-fluid jet cleaning in cleaning of a polished substrate for a next-generation device with copper interconnects. Further, by carrying out two-fluid jet cleaning before pencil scrub cleaning, the lifetime of a pencil-type cleaning member can be extended while maintaining the pencil scrub cleaning performance.

Though in this embodiment the final finish cleaning is carried out by pencil scrub cleaning, it is also possible to carry out roll scrub cleaning as the final finish cleaning after the finish cleaning by two-fluid jet cleaning.

While the present invention has been described with reference to preferred embodiments, it is understood that the present invention is not limited to the embodiments described above, but is capable of various changes and modifications within the scope of the inventive concept as expressed herein.

What is claimed is:

1. A substrate cleaning method comprising:
   carrying out primary cleaning of a surface of a substrate by scrub cleaning using a neutral or alkaline liquid chemical as a cleaning liquid, wherein the surface of the substrate has been polished by chemical mechanical polishing after forming copper interconnects in the surface of the substrate, and wherein a surface of the copper interconnects is exposed on the surface of the substrate after polishing;

carrying out finish cleaning of the surface of the substrate by two-fluid jet cleaning, which cleans the surface of the substrate in a non-contact manner, by jetting carbonated water, comprising pure water or ultrapure water containing dissolved $CO_2$ gas, from a two-fluid nozzle toward the surface of the substrate; and subsequently carrying out final finish cleaning of the surface of the substrate by scrub cleaning using a neutral or alkaline liquid chemical as a cleaning liquid, and then drying the surface of the substrate.

2. The substrate cleaning method according to claim 1, wherein the primary cleaning is roll scrub cleaning performed by rubbing a roll cleaning member against the surface of the substrate, and the final finish cleaning is pencil scrub cleaning performed by rubbing a pencil-type cleaning member against the surface of the substrate.

3. The substrate cleaning method according to claim 1, wherein the surface of the substrate is hydrophobic.

4. The substrate cleaning method according to claim 1, wherein an insulating film in the surface of the substrate has a low dielectric constant.

* * * * *